United States Patent
Okumoto et al.

(10) Patent No.: US 9,136,475 B2
(45) Date of Patent: Sep. 15, 2015

(54) ORGANIC EL ELEMENT AND METHOD FOR PRODUCING SAME

(71) Applicants: PANASONIC CORPORATION, Osaka (JP); DYDEN CORPORATION, Fukuoka (JP)

(72) Inventors: Kenji Okumoto, Kyoto (JP); Gosuke Sakamoto, Kyoto (JP); Masaomi Shibata, Osaka (JP); Izumi Kakinoki, Fukuoka (JP); Masataka Watanabe, Fukuoka (JP); Tomoko Matoba, Fukuoka (JP); Mitsuharu Noto, Fukuoka (JP); Yasuyuki Goto, Fukuoka (JP)

(73) Assignees: JOLED INC., Tokyo (JP); DYDEN CORPORATION, Fukuoka (JP)

( * ) Notice: Subject to any disclaimer, the term of this patent is extended or adjusted under 35 U.S.C. 154(b) by 224 days.

(21) Appl. No.: 13/705,487

(22) Filed: Dec. 5, 2012

(65) Prior Publication Data

US 2013/0092918 A1    Apr. 18, 2013

Related U.S. Application Data

(63) Continuation of application No. PCT/JP2010/007497, filed on Dec. 24, 2010.

(51) Int. Cl.
| | |
|---|---|
| *H01L 51/00* | (2006.01) |
| *H01L 27/32* | (2006.01) |
| *H01L 51/50* | (2006.01) |
| *H01L 51/56* | (2006.01) |
| *C09K 11/06* | (2006.01) |
| *H05B 33/14* | (2006.01) |

(52) U.S. Cl.
CPC ............ *H01L 51/0002* (2013.01); *C09K 11/06* (2013.01); *H01L 51/0007* (2013.01); *H01L 51/0034* (2013.01); *H01L 51/0039* (2013.01); *H01L 51/56* (2013.01); *H05B 33/14* (2013.01); *C09K 2211/1416* (2013.01); *H01L 27/3246* (2013.01); *H01L 51/0005* (2013.01); *H01L 51/0043* (2013.01); *H01L 51/5072* (2013.01); *H01L 2251/308* (2013.01); *H01L 2251/5353* (2013.01)

(58) Field of Classification Search
CPC ........... C09K 11/06; C09K 2211/1416; H01L 51/0002; H01L 51/0007; H01L 51/0034; H01L 51/0039; H01L 51/56; H01L 2251/308; H01L 2251/5353; H01L 27/3246; H01L 51/0005; H01L 51/0043; H01L 51/5072; H05B 33/14
USPC ........................................................ 528/398
See application file for complete search history.

(56) References Cited

U.S. PATENT DOCUMENTS

| | | | | |
|---|---|---|---|---|
| 4,072,653 | A * | 2/1978 | Moedritzer | 524/129 |
| 5,247,190 | A | 9/1993 | Friend et al. | |
| 7,098,297 | B2 * | 8/2006 | Pei | 528/423 |
| 7,659,540 | B2 | 2/2010 | Heun et al. | |
| 2003/0044645 | A1 | 3/2003 | Kambe et al. | |
| 2004/0096570 | A1 * | 5/2004 | Weaver et al. | 427/66 |
| 2005/0033015 | A1 | 2/2005 | Pei | |
| 2005/0064241 | A1 | 3/2005 | Kambe et al. | |
| 2007/0080343 | A1 * | 4/2007 | Heun et al. | 257/40 |
| 2007/0228356 | A1 | 10/2007 | Makiura et al. | |
| 2007/0290605 | A1 | 12/2007 | Goto et al. | |
| 2009/0056811 | A1 | 3/2009 | Noguchi et al. | |
| 2010/0102305 | A1 | 4/2010 | Heun et al. | |

FOREIGN PATENT DOCUMENTS

| | | |
|---|---|---|
| CN | 1894357 | 1/2007 |
| CN | 101330132 | 12/2008 |
| JP | 02-015595 | 1/1990 |
| JP | 04-500582 | 1/1992 |
| JP | 2003-332075 | 11/2003 |
| JP | 2003-347061 | 12/2003 |
| JP | 2006-073583 | 3/2006 |
| JP | 2007-053286 | 3/2007 |
| JP | 2007-517079 | 6/2007 |
| JP | 2007-224282 | 9/2007 |
| JP | 2007-281039 | 10/2007 |
| JP | 2009-158756 | 7/2009 |
| JP | 2010-146822 | 7/2010 |
| JP | 2010-189454 | 9/2010 |
| WO | 90/13148 | 11/1990 |
| WO | 2005/040302 | 5/2005 |
| WO | 2005/104628 | 11/2005 |
| WO | 2009/147011 | 12/2009 |

OTHER PUBLICATIONS

Padmaperuma et al., "New Charge Transporting Host Material for Short Wavelength Organic Electrophosphorescence: 2,7 Bis(diphenylphosphine oxide)-9,9-dimethylfluorene," Chem. Mater. 2006, 18, 2389-2396.*

(Continued)

*Primary Examiner* — Paul A Zucker
*Assistant Examiner* — Mark Luderer
(74) *Attorney, Agent, or Firm* — Greenblum & Bernstein, P.L.C.

(57) ABSTRACT

The present invention is to provide a method of favorably forming an organic EL device with the inverted structure by the wet process. On that account, an organic EL device includes a cathode, an electron injection layer, a light emitting layer, a hole transport layer, a hole injection layer, an anode are formed in this order on a substrate. The electron injection layer is formed by applying ink between banks and drying the ink. The ink is formed by dissolving a polymer compound having an organic phosphine oxide skeleton in an alcohol solvent. The light emitting layer is formed by applying ink between components of the bank and the drying the ink. The ink is formed by dissolving material for light emitting layer such as polyphenylene vinylene (PPV) derivative or polyfluorene derivative in a nonpolar solvent.

14 Claims, 9 Drawing Sheets

(56) References Cited

OTHER PUBLICATIONS

Chu et al., "Highly efficient and stable inverted bottom-emission organic light emitting devices" *Applied Physics Letters* 89, 053503 (2006).

International Search Report for PCT/JP2010/007497, along with an English-language translation, mailed Mar. 29, 2011.
Chinese Office action for Application No. 201080067046.5, issued Apr. 20, 2015 along with a partial English language translation thereof.

* cited by examiner

Light

FIG. 6A
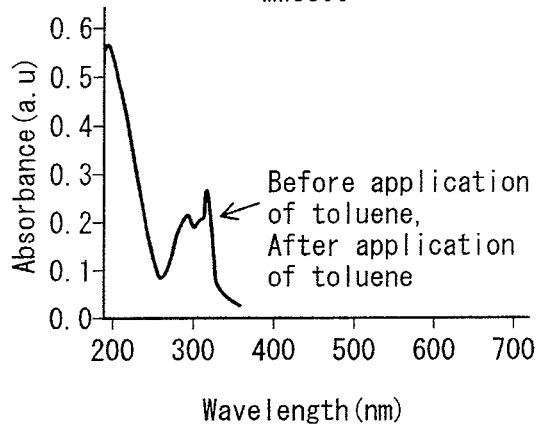
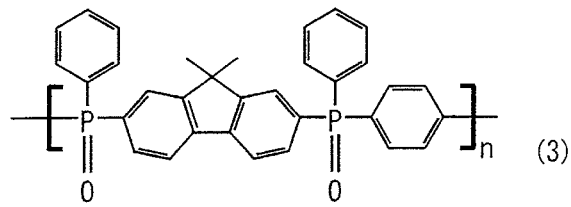
(3)
FIG. 6B
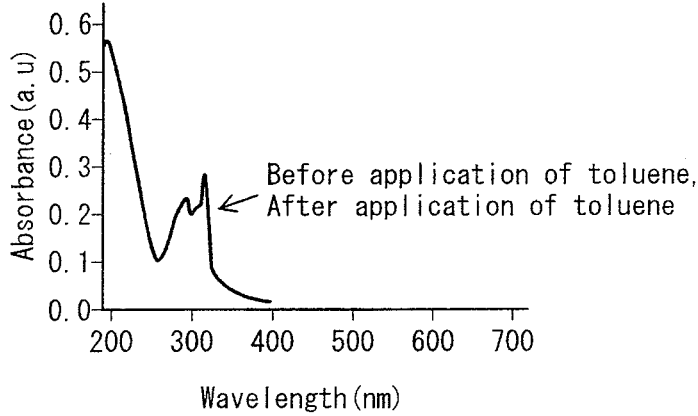
FIG. 6C
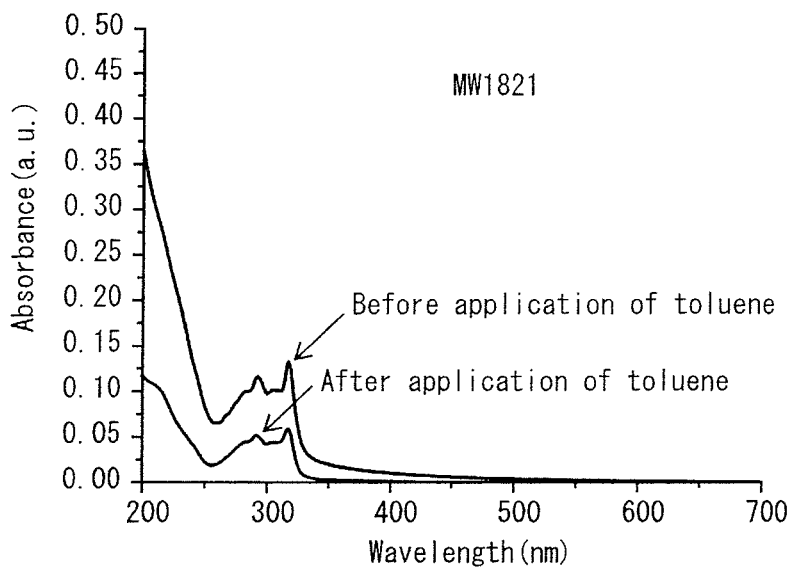

FIG. 9
1. Synthesis of chloro(diethylamino)phenylphosphine
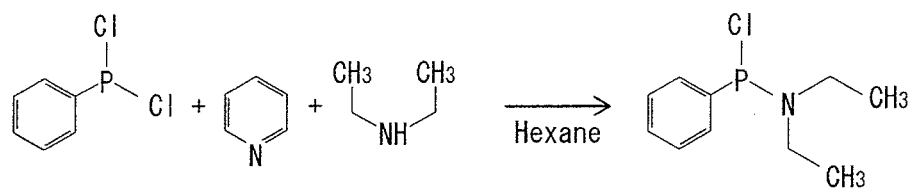
2. Synthesis of 2,7-Bis(phenylphosphinoyl)-9,9-dimethylfluorine (monomer)
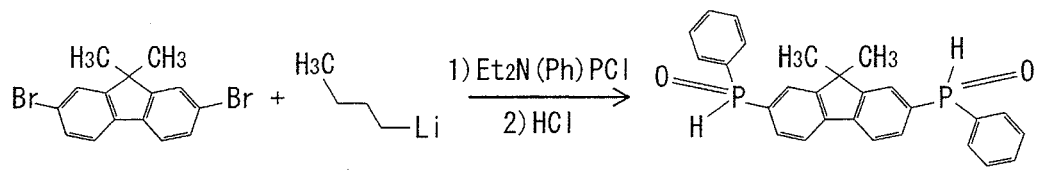
3. Polymerization of 2,7-Bis(phenylphosphinoyl)fluorine and 1,4-diiodo benzene
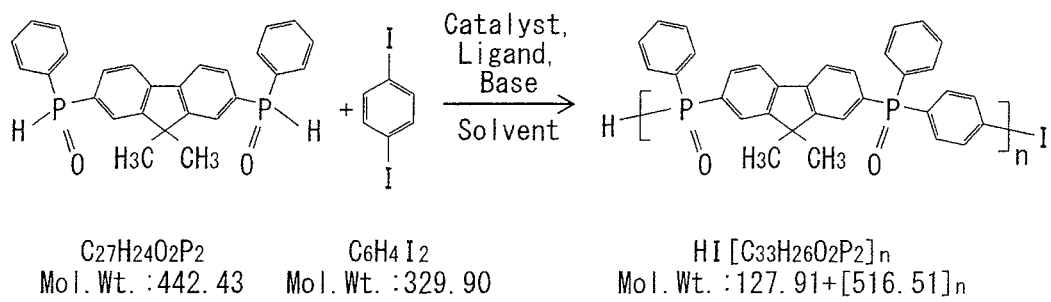
C27H24O2P2
Mol.Wt.:442.43
C6H4I2
Mol.Wt.:329.90
HI[C33H26O2P2]n
Mol.Wt.:127.91+[516.51]n

FIG. 10
1. Synthesis of 5,5'-Bis(phenylphosphinoyl)-2,2'-bithiophene
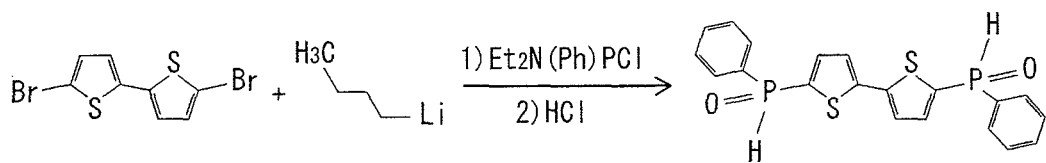
2. Polymerization of 5,5'-Bis(phenylphosphinoyl)-2,2'-bithiophene and 1,4-diiodo benzene
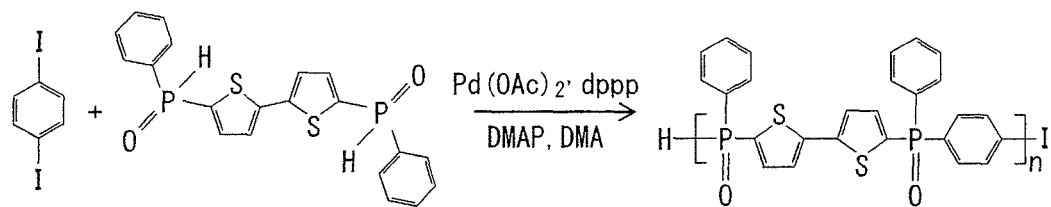

ORGANIC EL ELEMENT AND METHOD FOR PRODUCING SAME

CROSS REFERENCE TO RELATED APPLICATION

This is a continuation application of PCT Application No. PCT/JP2010/007497 filed Dec. 24, 2010, designating the United States of America, the disclosure of which, including the specification, drawings and claims, is incorporated herein by reference in its entirety.

TECHNICAL FIELD

The present disclosure relates to organic electroluminescent (EL) device and a method of manufacturing the same.

DESCRIPTION OF THE RELATED ART

Organic EL devices are light emitting devices that utilize electroluminescence phenomenon of organic compounds. Since the organic EL devices easily show high luminance light emission, they have been put into practical use in display devices, illumination apparatuses and the like.

In order to popularize these organic EL devices, they are required to be manufactured at a lower cost than liquid crystal displays, fluorescent bulbs, LED illumination devices and the like. The structures and manufacturing methods of the organic EL devices are accordingly desired to be simple.

An organic EL device that is most broadly used nowadays has, as described in Patent Literature 1, the structure in which an anode is formed on a substrate, an organic layer is formed by vacuum deposition, and a cathode is formed on the organic layer. In recent years, however, an approach for forming an organic layer by a wet process has been disclosed as described in Patent Literature 2. In the wet process, ink including organic layer forming material is applied and dried to form an organic layer. Also, organic EL devices whose light emitting layers are formed by applying a nonpolar solvent in which various high polymer materials are dissolved materials are widely developed.

According to such a wet process, it is possible to form an organic layer without using vacuum equipment, and also to relatively easily form a light emitting layer, etc. of a large panel. Therefore, the wet process is desirable from the standpoint of the time required for manufacturing the devices.

Non-Patent Literature 1 discloses an inverted structure of an organic EL device. In the inverted structure, the layers are formed in the reverse order from the normal order. That is, a cathode is formed closer to a substrate than an anode and the anode is formed on an organic layer.

Development of organic EL devices with such inverted structures increases options for designing the device structure of an organic EL device, and brings advantages of improved design flexibility.

To be specific, when attempting to realize an active-matrix organic EL device by forming a transistor array on a large substrate and forming an organic EL device array on the transistor array, it is desirable to form highly responsive n-type TFTs by using amorphous silicon, microcrystalline silicon and oxide semiconductor (indium-zinc-gallium oxide and the like) as channel material. When using n-type TFTs, each organic EL device is required to have the inverted structure in order to realize driving with a simple pixel circuit composed of two TFTs and one capacitor.

CITATION LIST

Patent Literature

[Patent Literature 1]
Japanese Patent Application Publication No. H2-15595
[Patent Literature 2]
Japanese Patent Application Publication No. H4-500582
[Patent Literature 3]
WO No. 2005-104628
[Patent Literature 4]
Japanese Patent Application Publication No. 2007-053286

Non-Patent Literature

[Non-Patent Literature 1]
Applied Physics Letters 89 053503, 2006.

SUMMARY

If the wet process can be used to form organic layers such as a light emitting layer of organic EL devices with the inverted structure, this is advantageous in realizing a large organic EL apparatus. When the wet process is used to form organic layers such as a light emitting layer by using a nonpolar solvent, material of an electron injection layer or an electron transport layer, which is formed under the organic layers, is required to be insoluble in a nonpolar solvent included in ink used for forming the organic layers, in addition to having film-forming property and electron-transporting property.

However, there has been hardly found material including all of these required properties.

Although electron transport material that can be applied by the wet process is disclosed by Patent Literature 3, for example, if an electron injection layer or an electron transport layer is formed of such electron transport material, the electron transport material dissolves in a nonpolar solvent of ink for forming an organic layer when an organic layer such as a light emitting layer is formed thereon by the wet process. Therefore, the film structure cannot be maintained. Accordingly, such material is not suitable for material for forming an electron injection layer or an electron transport layer of an organic EL device with the inverted structure.

Patent Literature 4 discloses an organic EL device with the inverted structure and a method of forming an electron injection metal oxide layer by applying an inorganic substance such as zinc oxide. However, processing involving a high temperature is generally required to form a metal oxide layer by this method, and accordingly, it cannot be considered as a simple manufacturing method. In addition, the metal oxide layer formed by this method has low electron injection characteristics, and therefore high voltage is required to drive the organic EL device and efficiency is also low. Further, the metal oxide layer formed by this method generally has little uniformity and rough film surface, and accordingly a short circuit due to a pinhole easily occurs. As a result, it is difficult to obtain stable properties.

Due to such background, a high performance, long-life organic EL device with the inverted structure has not realized by forming organic layers such as a light emitting layer by the wet process.

One non-limiting and exemplary embodiment provides a method of favorably manufacturing an organic EL device with the inverted structure by the wet process.

Solution to Problem

In one general aspect, the techniques disclosed here feature a method of manufacturing an organic EL device having a substrate, and a cathode, a plurality of organic layers and an anode layered on the substrate in an order as stated, the method comprising: a first step of forming a first organic layer including a polymer compound having an organic phosphine oxide skeleton; and a second step of forming, on the first organic layer, a second organic layer by a wet process using a solution including organic material and a solvent.

The polymer compound preferably has a weighted average molecular weight that is equal to or more than 2000. Such a polymer compound includes both "polymer", whose molecular weight is approximately more than 10000, and "oligomer", whose molecular weight is less than that.

Advantageous Effects of Invention

According to the above-mentioned method of manufacturing the organic EL device, the first organic layer formed in the first step includes a polymer compound having an organic phosphine oxide skeleton.

A compound having an organic phosphine oxide skeleton is known as material essentially having electron-transporting property. When this compound having the organic phosphine oxide skeleton is polymerized, solubility of this compound in a nonpolar solvent decreases and the compound becomes insoluble. Accordingly, when the second organic layer is layered in the second step by the wet process for applying a solution including organic material and a nonpolar solvent, the first organic layer does not dissolve. It is thus possible to stably form the layered structure of the organic layers.

Further, the first organic layer has excellent electron-transporting property due to the organic phosphine oxide skeleton included in the polymer compound.

Also, the above-mentioned organic EL device includes a polymer compound having an organic phosphine oxide skeleton in the first organic layer, and as a result, the same effect is yielded.

In this way, according to the method of manufacturing the organic EL device pertaining to the above aspect, it is possible to stably form the layered structure including the first organic layer and the second organic layer. As a result, uniformity in the luminescence brightness can be achieved, and a longer useful life for the device can be promoted.

Further, as described above, the first organic layer is insoluble in a nonpolar solvent, and accordingly material used for constituting the second organic layer can be widely selected from organic material soluble in a nonpolar solvent. That is, when the second organic layer is a light emitting layer, options for light emitting material used for the light emitting layer become wider.

Further, according to the above aspect, the organic EL device has the inverted structure in which the cathode is provided to face the substrate. Therefore, even when an n-channel type TFT having an excellent switching property is formed on the TFT substrate, it is easily connect the TFT and the organic EL device. Accordingly, the present aspect is particularly suitable when an n-channel TFT is formed on the substrate.

Thus, the organic EL device manufactured by the method pertaining to the present aspect has the inverted structure, and accordingly contributes to wider options in designing an organic EL device, and has a high practical value.

These general and specific aspects may be implemented using a device.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF DRAWINGS

FIGS. 6A-6C show experimental results for examining toluene resistance of an organic phosphine oxide compound pertaining to Experiment.

FIG. 9 shows a method of synthesizing an organic phosphine oxide compound pertaining to Experiment.

FIG. 10 shows a method of synthesizing an organic phosphine oxide compound pertaining to Experiment.

DETAILED DESCRIPTION

<Aspects of the Invention>

Figure 1:
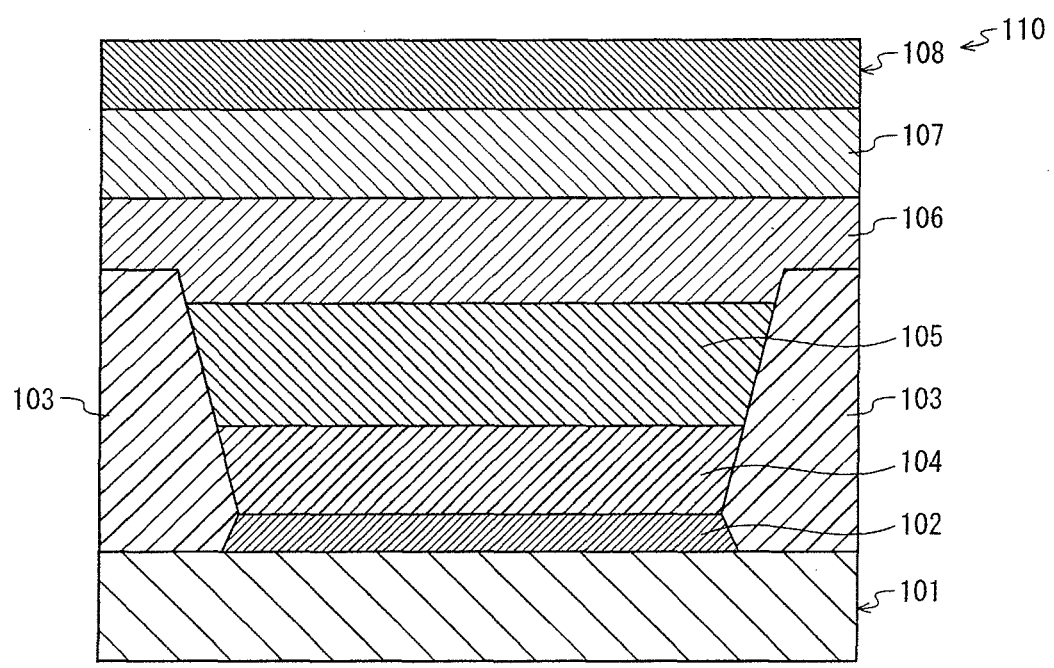
FIG. 1 is a cross-sectional schematic diagram showing an organic EL device with an inverted structure pertaining to Experiment.

A method of manufacturing an organic EL device pertaining to an aspect of the present disclosure is a method of manufacturing an organic EL device having a substrate, and a cathode, a plurality of organic layers and an anode layered on the substrate in an order as stated, the method comprising: a first step of forming a first organic layer including a polymer compound having an organic phosphine oxide skeleton; and a second step of forming, on the first organic layer, a second organic layer by a wet process using a solution including organic material and a solvent.

The polymer compound having the organic phosphine oxide skeleton is insoluble in a nonpolar solvent. The first organic layer accordingly does not dissolve when the second organic layer is layered by the wet process using a nonpolar solvent in the second step. Thus, it is possible to stably form the layered structure including the two organic layers. Further, the first organic layer has electron-transporting property due to the organic phosphine oxide skeleton included in the polymer compound.

In addition, the organic EL device pertaining to the aspect of the present invention includes the substrate, the cathode, the plurality of the organic layers, and the anode. The cathode, the plurality of organic layers and the anode are layered in the stated order, the cathode being closer to the substrate. The plurality of organic layers include the first organic layer and the second organic layer. The first organic layer includes a polymer compound having the organic phosphine oxide skeleton. The second organic layer is formed by layering organic material on the first organic layer to face the anode. Such an organic EL device yields the same effect as the above method of manufacturing the organic EL device.

It is desirable that the weighted average molecular weight $M_w$ of the polymer compound having the above organic phosphine oxide skeleton is equal to or more than 2000 so as to be adequately insoluble in a nonpolar solvent. Further, out of consideration for forming the first organic layer by applying the polymer compound by the wet process, the weighted average molecular weight Mw of the polymer compound is desirably equal to or less than one million. If the molecular weight is more than that, solubility of the polymer compound becomes too low, and it becomes difficult to dissolve the polymer compound in a solvent.

It is desirable that the polymer compound having the organic phosphine oxide skeleton is a compound with the following general structural formulas.

[CHEM. 7]

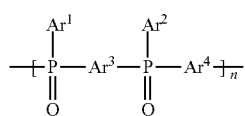

(1)

In the formula (1), each of $Ar^1$ and $Ar^2$ is a monovalent aromatic chromophore, and each of $Ar^3$ and $Ar^4$ is a divalent aromatic chromophore. $Ar^1$ and $Ar^2$ may be the same or different, and $Ar^3$ and $Ar^4$ may be the same or different. The letter n is a natural number between 2 and 2000.

Note that an aromatic chromophore may be a phenyl group with the monocyclic aromatic structure, or a naphthyl group with the polycyclic aromatic structure or the heterocyclic structure, for example.

[CHEM. 8]

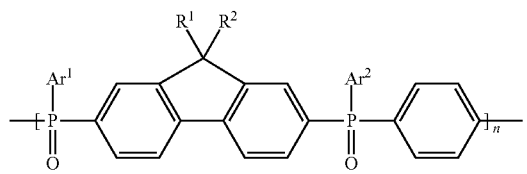

(2)

Here, in the formula (2), each of $Ar^1$ and $Ar^2$ is an aromatic chromophore, and each of $R^1$ and $R^2$ is an aliphatic substituent. $Ar^1$ and $Ar^2$ may be the same and different, and $R^1$ and $R^2$ may be the same and different. The letter n is a natural number between 2 and 2000.

[CHEM. 9]

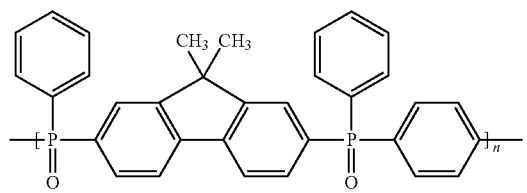

(3)

In the formula (3), the letter n is a natural number between 2 and 2000.

The following further explains $Ar^1$-$Ar^4$ included in the above structural formulas (1) and (2).

Each of $Ar^1$ and $Ar^2$ is a monovalent "aromatic chromophore". $Ar^1$ and $Ar^2$ may be the same or different. Examples of $Ar^1$ and $Ar^2$ include a monocyclic aromatic chromophore such as a benzene ring, a thiophene ring, a triazine ring, a furan ring, a pyrazine ring and a pyridine ring, each of which may be a heterocyclic ring, a condensed polycyclic aromatic chromophore such as a naphthalene ring, a anthracene ring, a thieno[3,2-b]thiophene ring, a phenanthrene ring, a fluorene ring and a furo[3,2-b]furan ring, each of which may be a heterocyclic ring, a ring-aggregated aromatic such as a biphenyl ring, a terphenyl ring, a bithiophene ring and a bifuran ring, each of which may be a heterocyclic ring, a combination of a heterocyclic ring and an aromatic chromophore such as an acridine ring, an isoquinoline ring, an indole ring, a carbazole ring, a carboline ring, a quinoline ring, a dibenzofuran ring, a cinnoline ring, a thionaphthene ring, a 1,10-phenanthroline ring, a phenothiazine ring, a purine ring, a benzofuran ring and a silol ring. Further, one or more hydrogen atoms of these aromatic chromophores may be replaced with an alkyl group, a diarylphosphinyl group, or the above-mentioned aromatic chromophores.

Each of $Ar^3$ and $Ar^4$ is a divalent "aromatic chromophore", and represents an arylene group, an alkenylene group, an alkynylene group or a divalent heterocyclic group.

The carbon number of an arylene group is normally from 6 to 60, and preferably, from 6 to 20. Examples of arylene groups include phenylene groups (groups whose numbers are from 1 to 3 in the following CHEM. 10), naphthalenediyl groups (groups whose numbers are from 4 to 13 in the following CHEM. 10), anthracenylene groups (groups whose numbers are from 14 to 19 in the following CHEM. 10), biphenylene groups (groups whose numbers are from 20 to 23 in the following CHEM. 10), triphenylene groups (groups whose numbers are from 24 to 26 in the following CHEM. 10) and condensed ring compound groups (groups whose numbers are from 27 to 33 in the following CHEM. 10). Further, one or more hydrogen atoms of these arylene groups may be replaced with an alkyl group, a diarylphosphinyl group, or above-mentioned monovalent aromatic chromophores. Note that the carbon number of an arylene group does not include the carbon number of a substituent group.

[CHEM. 10]

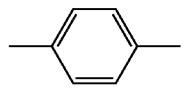

1

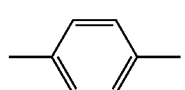

2

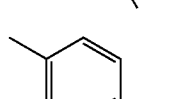

3

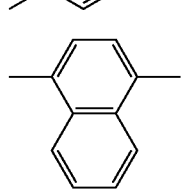

4

5
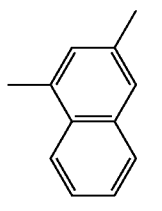
6
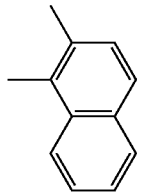
7
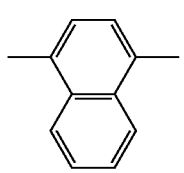
8
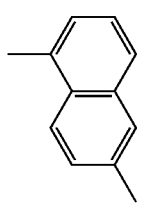
9
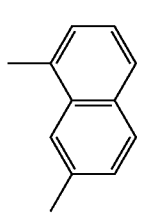
10
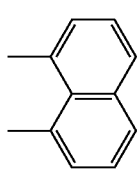
11
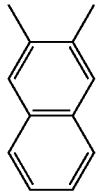
12
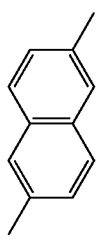
13
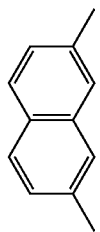
14
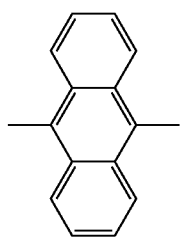
15
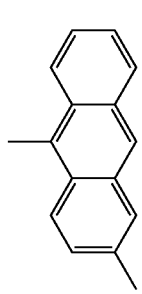
16
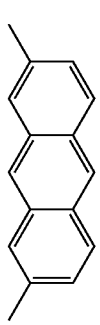
17
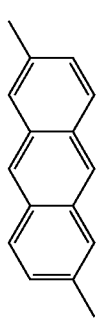

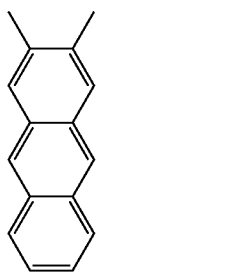

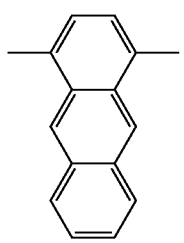

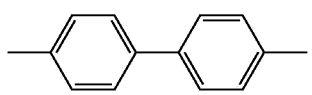

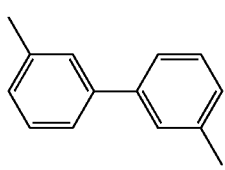

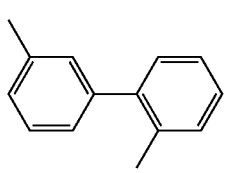

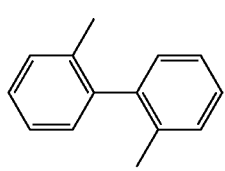

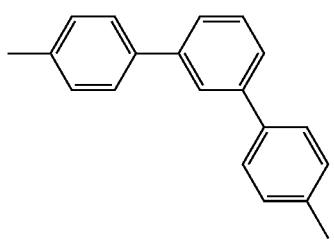

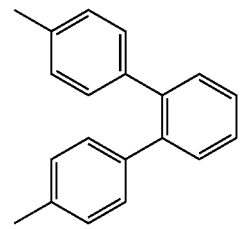

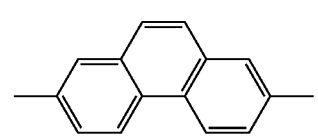

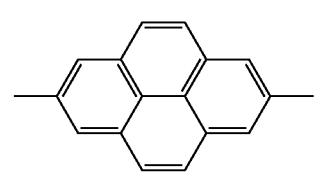

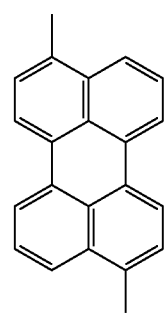

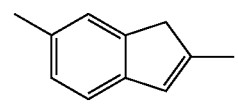

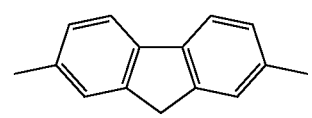

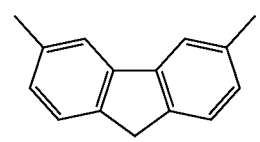

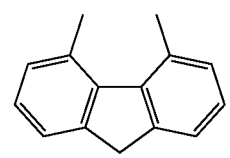

A divalent heterocyclic group is a group of atoms of a heterocyclic compound from which two hydrogen atoms are removed, and whose carbon number is normally from 2 to 60 and preferably from 4 to 20. Here, a heterocyclic compound is an organic compound with rings constituted not only from carbon atoms but also from heteroatoms such as oxygen, sulfur, nitrogen, phosphorus or boron. The following exemplifies divalent heterocyclic groups. Further, one or more hydrogen atoms of these arylene groups may be replaced with an alkyl group, a diarylphosphinyl group, or the above-mentioned monovalent aromatic chromophores. Note that the carbon number of a divalent heterocyclic group does not include the carbon number of a substituent group.

Divalent heterocyclic groups including nitrogen as a heteroatom: pyridine-diyl groups (groups whose numbers are from 34 to 39 in the following CHEM. 11); diazaphenylene groups (groups whose numbers are from 40 to 43 in the following CHEM. 11); quinolinediyl groups (groups whose numbers are from 44 to 58 in the following CHEM. 11); quinoxalinediyl groups (groups whose numbers are from 59 to 63 in the following CHEM. 11); acridinediyl groups (groups whose numbers are from 64 to 67 in the following CHEM. 11); bipyridyldiyl groups (groups whose numbers are from 68 to 70 in the following CHEM. 11); phenanthrolinediyl groups (groups whose numbers are from 71 to 73 in the following CHEM. 11); and the like.

Groups that include silicon, nitrogen, sulfur, selenium, phosphorus and the like as a heteroatom and each have the fluorine structure (groups whose numbers are from 74 to 91 in the following CHEM. 11). Further, in view of luminous efficiency, it is desirable that these arylene groups include an aromatic amine monomer such as a carbazole group including nitrogen atom (groups whose numbers are from 77 to 79 in the following CHEM. 11) and a triphenylaminediyl group.

Five-membered ring heterocycle groups including silicon, nitrogen, sulfur, selenium, phosphorus and the like as a heteroatom (groups whose numbers are from 92 to 96 in the following CHEM. 12).

Five-membered ring condensed heterocycle groups including silicon, nitrogen, sulfur, selenium, phosphorus and the like as a heteroatom (groups whose numbers are 97-108 in the following CHEM. 12), such as a benzothiadiazole-4,7-diyl group and a benzoxadiazole-4,7-diyl group.

Five-membered ring heterocycle groups that include silicon, nitrogen, sulfur, selenium and the like as a heteroatom and are linked together at a positions thereof to be dimers or oligomers (groups whose numbers are from 109 to 117 in the following CHEM. 12).

Five-membered ring heterocycle groups that include silicon, nitrogen, sulfur, selenium and the like as a heteroatom, and are linked to phenyl groups at a positions thereof (groups whose numbers are from 111 to 117 in the following CHEM. 12).

[CHEM. 11]

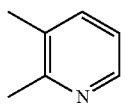
34

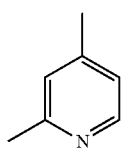
35

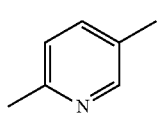
36

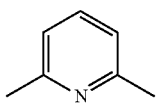
37

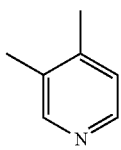
38

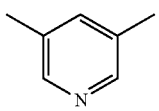
39

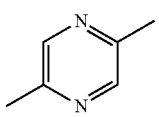
40

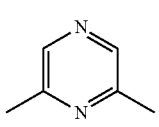
41

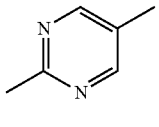
42

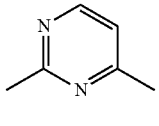
43

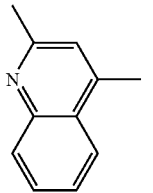
44

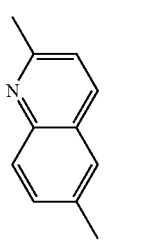
45

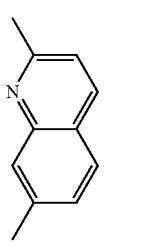
46

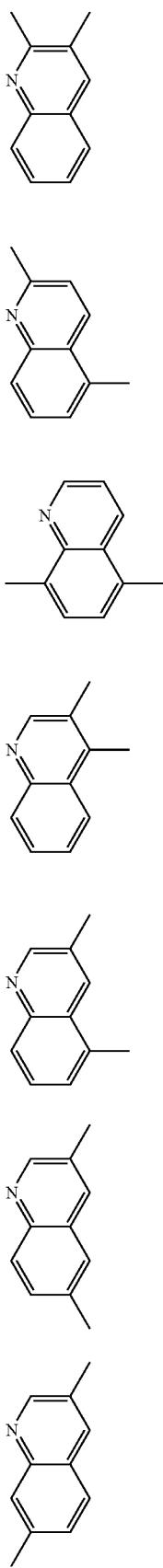
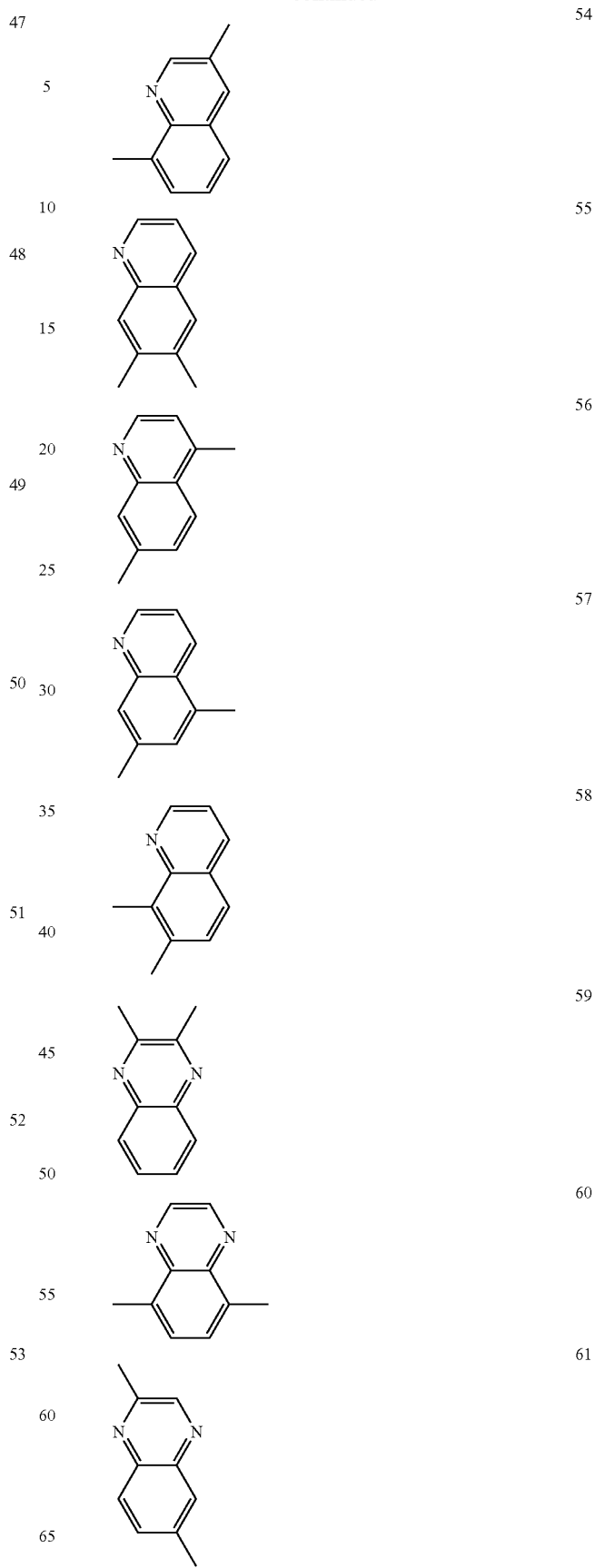

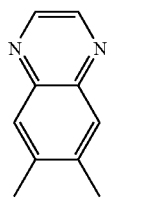
62
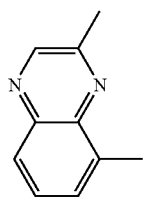
63
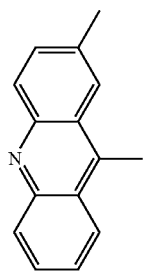
64
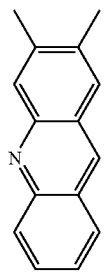
65
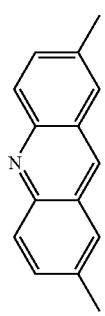
66
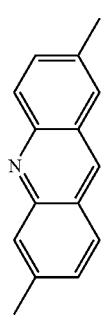
67
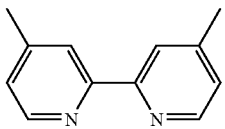
68
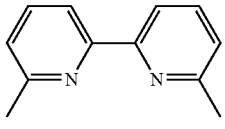
69
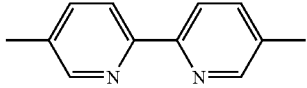
70
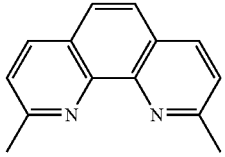
71
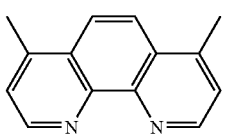
72
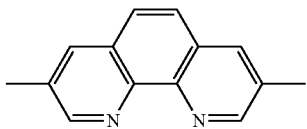
73
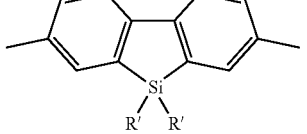
74
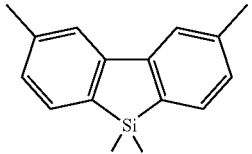
75
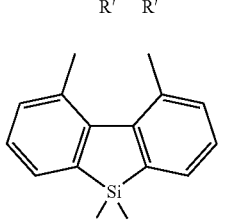
76
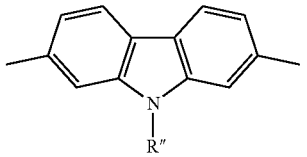
77

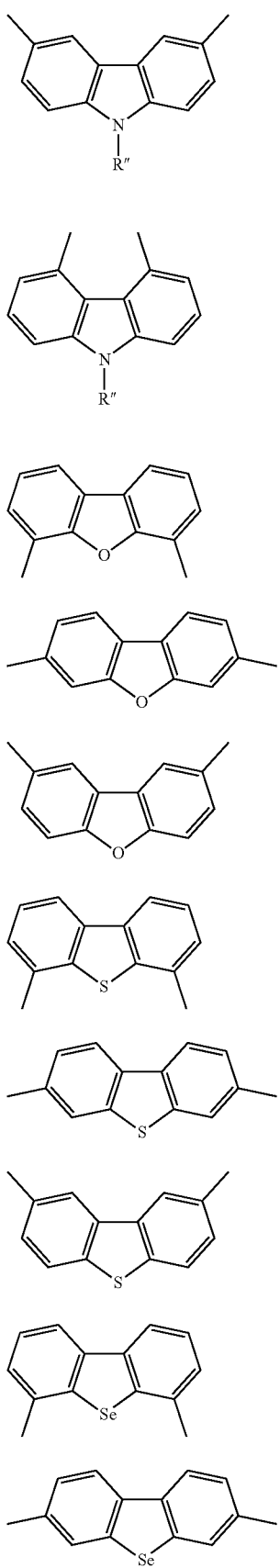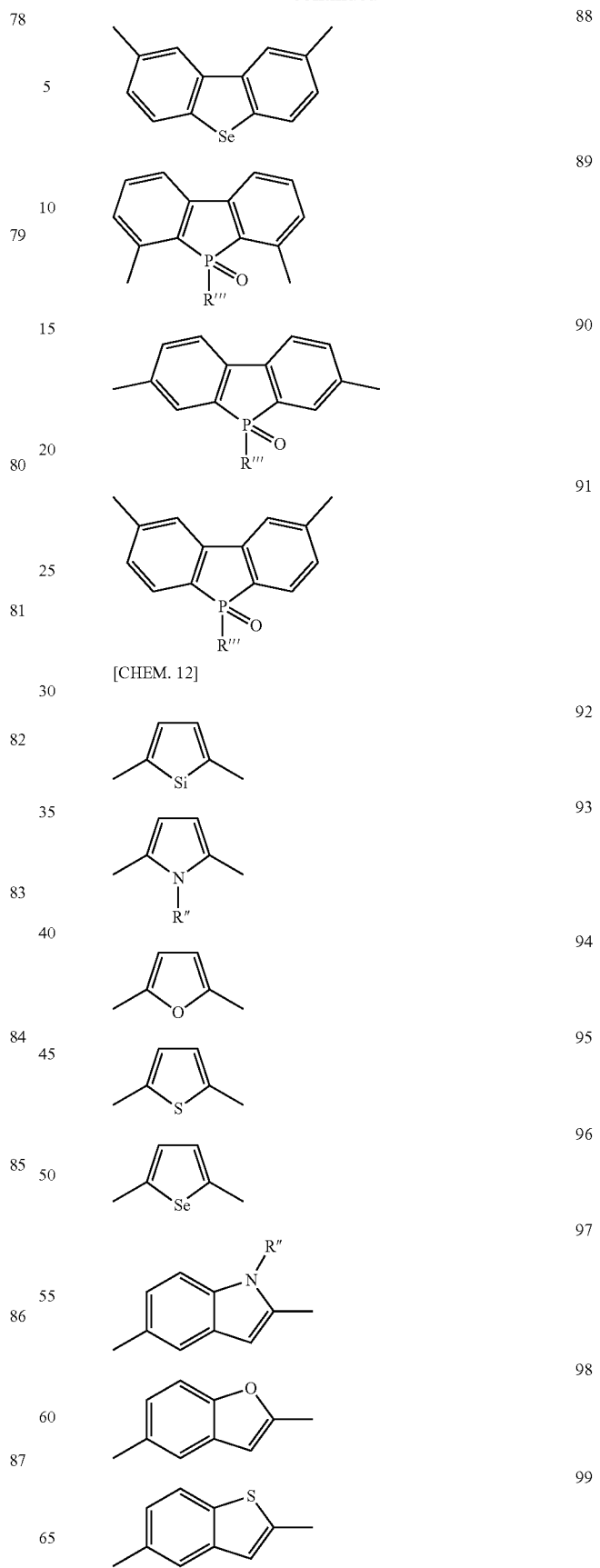

-continued

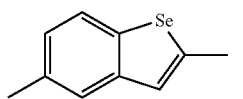
100

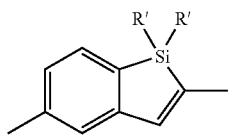
101

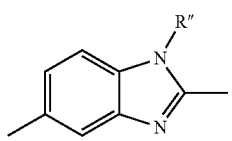
102

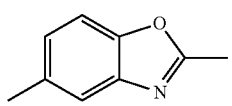
103

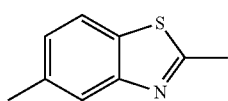
104

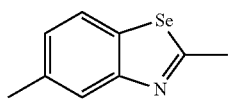
105

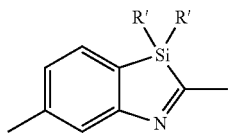
106

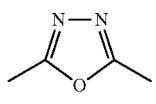
107

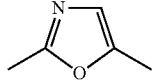
108

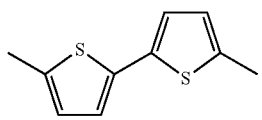
109

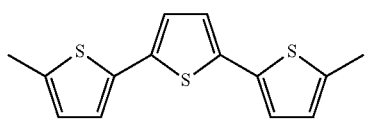
110

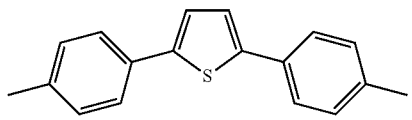
111

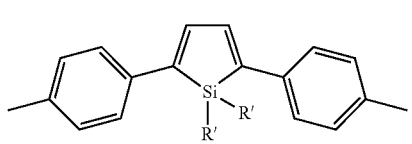
112

-continued

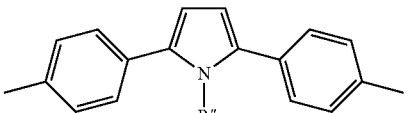
113

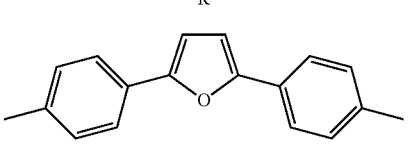
114

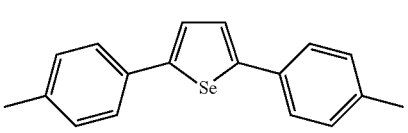
115

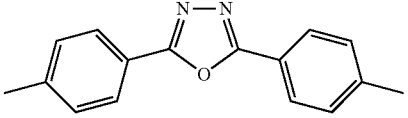
116

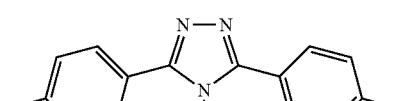
117

In the above CHEM. 11 and CHEM. 12, each of R', R'', R''' in the formulas independently represents each of an alkyl group, an aryl group and a monovalent heterocyclic group. An aryl group and a heterocyclic group may be replaced with an alkyl group, a diarylphosphinyl group, or the above-mentioned monovalent aromatic chromophores.

In the method of manufacturing the organic EL device pertaining to the above-mentioned aspect, it is desirable to use the wet process to form the first organic layer.

An aromatic solvent including a benzene ring or an aliphatic solvent including alkyl or alkene is desirable as a nonpolar solvent that is used to form the second organic layer by the wet process.

The ink jet method is desirable when the second organic layer is formed by the wet process.

High polymer material is desirable as organic material to form the second organic layer.

In the method of manufacturing the organic EL device and the organic EL device pertaining to the above aspect, the second organic layer may be a light emitting layer, an electron transport layer or a hole blocking layer.

It is also desirable to comprise the third step for layering, on the second organic layer that is a light emitting layer, the third organic layer including an aromatic amine compound. In this case, the aromatic amine compound included in the third organic layer works as hole transport material.

The organic EL device pertaining to the above aspect has the inverted structure. Accordingly, when the substrate is a TFT substrate, it is possible to realize a drive circuit of the organic EL device by using a simple pixel circuit composed of two n-TFTs and one capacitor.

In the method of manufacturing the organic EL device and the organic EL device pertaining to the above aspect, the first organic layer may include an alkali metal, an alkaline earth metal or rare earth metal in addition to an organic phosphine oxide compound.

In this case, it is desirable that an alkali metal, an alkaline earth metal or a rare earth metal is mixed in the first organic layer as an organometallic complex.

In the method of manufacturing the organic EL device and the organic EL device pertaining to the above aspect, the first layer may be an electron injection layer or an electron transport layer.

The second layer may be a light emitting layer, an electron transport layer or a hole blocking layer.

Experiment (Structure of Display Panel 100)

FIG. 1 is a cross-sectional schematic diagram showing an organic EL device with the inverted structure pertaining to Experiment. FIG. 1 shows a cross section of one organic EL device cut in a vertical direction with respect to a substrate (in an X direction in FIG. 2).

As shown in FIG. 1, an organic EL device 110 is constituted as follows: on the surface of a substrate 101, a cathode 102, an electron injection layer 104, a light emitting layer 105, a hole transport layer 106, a hole injection layer 107, and an anode are formed in the stated order. The organic EL device 110 is a bottom-emission type, and light emitted downward from the light emitting layer 105 is utilized.

The substrate 101 may be a simple glass substrate, a silicon substrate, a sapphire substrate or a substrate on which metal wiring lines is formed. Here, the substrate 101 is a TFT substrate on which a transistor array is formed and then a planarizing film is formed on the transistor array. Organic EL devices are arranged in matrix on the substrate 101 to form a display panel 100, and the panel can be driven by the active matrix method.

Figure 2:
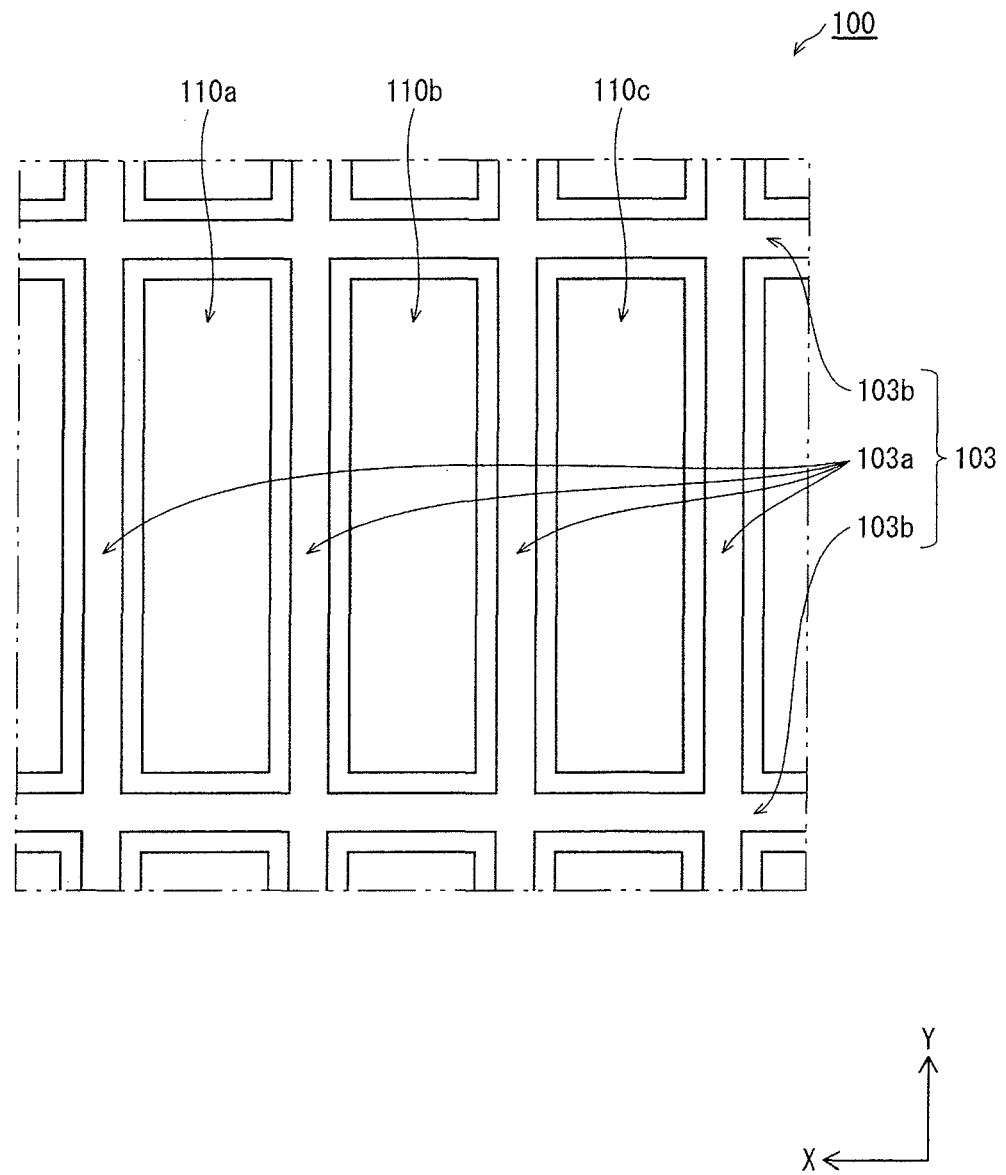
FIG. 2 is a plan view showing a part of a display panel 100 comprising an array of a plurality of organic EL devices 110 on a substrate 101.
Figure 3:
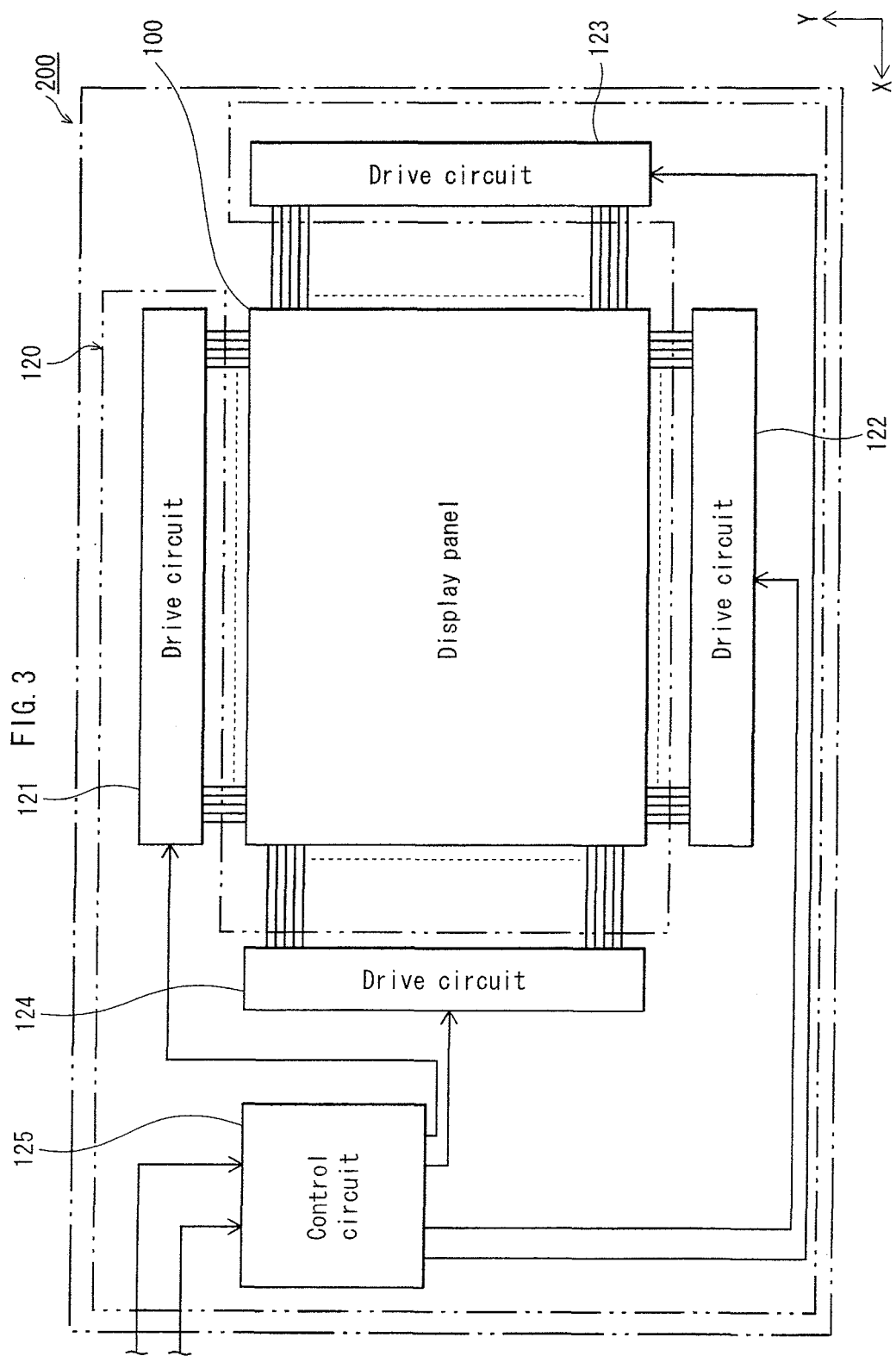
FIG. 3 shows the structure of a display apparatus 200 using the display panel 100.

FIG. 2 is a plan view showing a part of the display panel 100 comprising an array of a plurality of organic EL devices 110 on the substrate 101. In FIG. 2, organic EL devices 110a-110c correspond to subpixels whose colors are respectively R, G, and B. As shown in FIG. 3, in the display panel 100, subpixels each composed of the organic EL device 110 are arranged in matrix in the vertical direction and the horizontal direction (X-Y directions), one pixel is composed of adjacent three subpixels whose colors are R, G, and B, and the adjacent organic EL devices 110a, 110b, and 110c are partitioned by banks 103.

FIG. 3 shows the structure of a display apparatus 200 using the display panel 100.

The display device 200 includes the display panel 100 and a drive control unit 120 connected thereto. The drive control unit 120 includes four drive circuits 121-124 and a control circuit 125.

Figure 4:
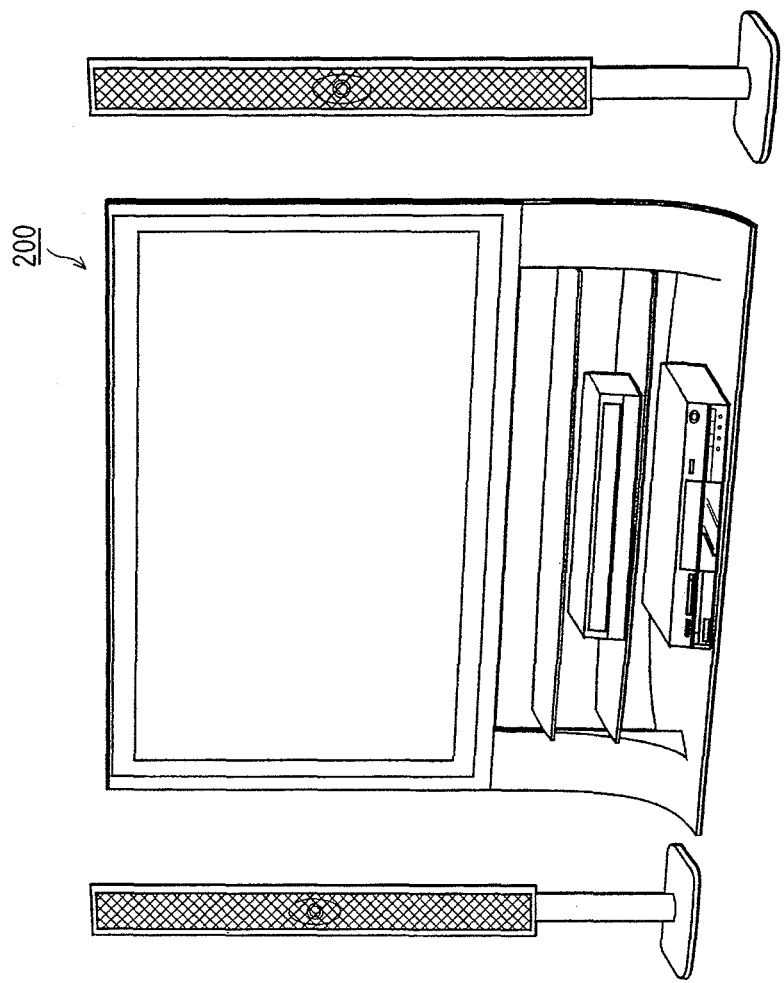
FIG. 4 shows an appearance profile of an example of a television system using the display apparatus 200.

FIG. 4 shows an appearance profile of an example of a television system using the display apparatus 200.

(Configuration of Organic EL device 110)

The following describes the configuration of the organic EL device 110 in details based on FIG. 1.

The substrate 101 is composed of TFTs, a line wire and a planarizing film that are formed on the surface of a glass substrate in the stated order.

In the case where a large panel is used, it is desirable that a μc-SiTFT formed from microcrystalline silicon is formed as a TFT.

Compared with a TFT formed from low-temperature polysilicon, a μc-SiTFT varies less in threshold voltage within the substrate. Compared with a TFT formed from amorphous silicon, threshold voltage of a μc-SiTFT when DC is applied is more stable. Further, if an n-channel TFT is formed on the substrate 101, an excellent switching property can be obtained compared with a p-channel TFT.

The planarizing film is formed from an organic material having excellent insulating properties such as polyimide, polyamide, or an acrylic resin material, and entirely covers arranged TFTs. A via is formed in the planarizing film for wiring.

The cathode 102 is layered on the surface of the substrate 101. The cathode 102 has a rectangular shape and is formed at an area corresponding to each subpixel on the planarizing film of the substrate 101. The cathode 102 of each subpixel has the same size.

Further, each cathode 102 is connected to the TFTs through the via formed in the planarizing film.

Although material constituting the cathode 102 is not particularly limited, it is desirable to use metal, conductive oxides, and conductive polymers.

Examples of the metal include aluminum, silver, molybdenum, tungsten, titanium, chromium, nickel, zinc and an alloy including any of them.

Examples of the conductive oxides include indium tin oxide, indium zinc oxide, zinc oxide and the like.

Examples of the conductive polymers include polyaniline, polythiophene, and mixture of them with acid or basic material.

Banks 103 are formed along gaps between the cathodes 102 that are adjacent to each other.

The banks 103 are composed of bank components 103a and 103b, and partition the subpixels that are adjacent to each other as described above. As shown in FIG. 2, the bank component 103a extends in the Y direction, and the bank component 103b extends in the X direction. The cross-sectional shape of each of the banks 103 is substantially trapezoidal, and each bank 103 has the same width.

The banks 103 are composed of insulating organic material (for instance, acrylic resins, polyimide resins, novolac-type phenolic resins and the like), and their surfaces have liquid repellency.

Further, in a concavity partitioned by the banks 103, an electron injection layer 104 and a light emitting layer 105 are formed in the stated order on the cathode 102. The subpixels surrounded by the banks 103 have the same size.

The electron injection layer 104 is formed from a polymer compound having an organic phosphine oxide skeleton. Details thereof are described later.

The light emitting layer 105 consists of a light emitting layer 105a, a light emitting layer 105b, and a light emitting layer 105c that are arranged in the lateral direction (in X direction in FIG. 2). The light emitting layer 105a emits blue light, the light emitting layer 105b emits green light, and the light emitting layer 105c emits red light.

As material of the light emitting layer 105, it is desirable to use high polymer material such as π-conjugated high polymer material or high polymer material containing low molecular pigment. Note that material of the light emitting layer 105 may be low molecular material if it dissolves in a nonpolar solvent.

The high polymer material is represented by poly(phenylene vinylene) (PPV) derivative or polyfluorene derivative.

Thus, by using high polymer light emitting material, the light emitting layer 105 can be formed by a printing technology, which is suitable for manufacturing a large display panel in great volume at a low cost.

Note that although the cathodes 102 and the electron injection layers 104 of three-colored organic EL devices are formed from common material, the light emitting layers 105 of three-colored organic EL devices 110 are formed from different light emitting materials emitting blue color, green color, and red color.

Further, so as to cover the light emitting layer 105 and the banks 103, a hole transport layer 106, a hole injection layer 107 and an anode 108 compose an organic EL device. The hole transport layer 106, the hole injection layer 107, and the anode 108 are common to all organic EL devices 110 arranged on the substrate 101.

The hole transport layer 106 can be made by forming a film with hole transport material. An examples of the hole transport material includes aromatic amine such as triphenylamine derivative.

The hole injection layer 107 can be made by forming a thin film with metal oxide material such as a molybdenum oxide, a tungsten oxide and the like by vacuum deposition method.

The anode 108 is a common electrode to all organic EL devices 110. Although material of the anode 108 is not particularly limited, metal and conductive oxides are desirable to be used.

Examples of the metal include aluminum, silver, molybdenum, tungsten, titanium, chromium, nickel, zinc and an alloy including any of them.

Examples of the conductive oxides include indium tin oxide, indium zinc oxide, zinc oxide and the like.

A passivation layer may be provided on the anode 108. The passivation layer is formed from silicon nitride (SiN), silicon oxynitride (SiON) and the like.

(Details of Electron Injection Layer 104)

The electron injection layer 104 is mainly formed from a polymer compound having an organic phosphine oxide skeleton. As described later, the polymer compound having the organic phosphine oxide skeleton has the structure in which three aryl groups are linked to phosphine oxide, and has electron-accepting property contributing to excellent electron-transporting property. Such a polymer compound is accordingly suitable for material of the electron injection layer 104. In addition to that, since this is the polymer compound, it is less likely to dissolve in a nonpolar solvent than low molecular compounds are. Here, it is desirable that the weighted average molecular weight of the polymer compound having the organic phosphine oxide skeleton is equal to or more than 2000 such that insolubility in a nonpolar solvent is obtained.

Further, when the polymer compound having the organic phosphine oxide skeleton is applied by the wet process, the polymer compound is dissolved in a polarity solvent and then applied. When the weighted average molecular weight of the polymer compound is large, the polymer compound is less likely to dissolve in a polarity solvent. It is therefore desirable that the weighted average molecular weight of the polymer compound is equal to or less than one million.

The following is a preferred chemical structure as an organic phosphine oxide compound constituting the electron injection layer 104.

[CHEM. 13]

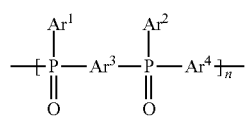

(1)

In the structure (1), each of $Ar^1$ and $Ar^2$ is a monovalent aromatic chromophore, and each of $Ar^3$ and $Ar^4$ is a divalent aromatic chromophore. $Ar^1$ and $Ar^2$ may be the same or different, and $Ar^3$ and $Ar^4$ may be the same or different. N is a natural number between 2 and 2000.

[CHEM. 14]

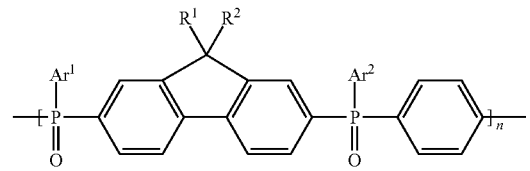

(2)

Here, in the structure (2), each of $Ar^1$ and $Ar^2$ is an aromatic chromophore, and each of $R^1$ and $R^2$ is an aliphatic substituent. $Ar^1$ and $Ar^2$ may be the same and different, and $R^1$ and $R^2$ may be the same and different. The letter n is a natural number between 2 and 2000.

[CHEM. 15]

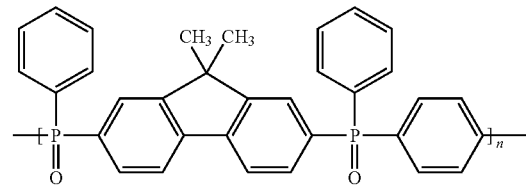

(3)

In the structure (3), the letter n is a natural number between 2 and 2000.

The electron injection layer 104 is mainly formed with the polymer compound having the organic phosphine oxide skeleton, and alkali metal, alkaline earth metal or rare earth metal may be added so as to increase electron-injection properties.

Electron-injection properties are improved since alkali metal, alkaline earth metal and rare earth metal have electron-donating property and donate electron to organic phosphine oxide compound that has electron-accepting property such that the compound is in a radical anion state. Such a radical anion species acts as a movable electron, and electric conductivity of the electron injection layer 104 can be improved.

When the electron injection layer 104 includes alkali metal, alkaline earth metal or rare earth metal, it is desirable that such metal is mixed as an organometallic complex. This is because they are unlikely to disperse in a solvent when mixed in the form of metal and metal is likely to oxidize, while they are likely to disperse in a solvent when mixed as an organometallic complex and metal can be prevented from oxidizing.

It is preferred that a weight ratio of alkali metal, alkaline earth metal, rare earth metal, or metal complex thereof to the polymer compound having the organic phosphine oxide skeleton is from 1% to 90%. Furthermore, a weight ratio of from 5% to 30% is particularly preferred.

As the alkali metal, lithium, sodium, potassium, rubidium and cesium are preferred. As the alkaline earth metal, magnesium, calcium, strontium and barium are preferred. As the rare earth metal, lanthanum, cerium, erbium, europium, scandium, yttrium and ytterbium are preferred.

A type of ligand of metal complex is not particularly limited, but preferred examples include β-diketone groups such as acetylacetone, 2,2,6,6-tetramethylheptane-3,5-dione (TMHD), dipivaloyl methane, dibenzoyl-methane, and oxine groups such as oxine and 2-methyloxine.

(Method of Manufacturing Display Panel 100)

Description is made on one example of a method of manufacturing the display panel 100.

Step of Manufacturing the Substrate 101:

A TFT layer is formed by forming a thin film by using the reactive sputtering method or a thin-film forming method using plasma. The TFT layer consists of TFTs, wiring, an SD electrode and μc-Si.

The substrate 101 is formed by forming the planarizing film to cover the TFTs.

On the substrate 101 formed as above, organic EL devices 110 having three colors are formed as described below.

Step of Forming the Cathode 102:

On the planarizing film, metal material for the cathode 102 is sputtered to form a thin film. This thin film is then patterned by wet etching to form the cathode 102.

Step of Forming the Banks 103:

Subsequently, resist material is applied on the planarizing film as bank material and patterned by photolithography to form the banks 103. The resist material is, for example, a photoresist or resist material that includes fluorine-based material or acrylic material.

Note that, during this step of forming the banks, the surfaces of the banks 103 may be treated with an alkaline solution, water, an organic solvent or the like, or treated by plasma treatment, in order to provide the surfaces of the banks 103 with repellency or to adjust the contact angles of the banks 103 with respect to the next ink to be applied.

Step of Forming the Electron Injection Layer 104:

The electron injection layer 104 is formed on the cathode 102 by the wet process.

In this step, the above-described material of the electron injection layer (polymer compound having the organic phosphine oxide skeleton, or the polymer compound to which alkali metal, alkaline earth metal, rare earth metal and metal complex are added) is dissolved in a polarity solvent to manufacture ink. This ink is applied between the adjacent banks 103 and dried to be the electron injection layer 104.

As polarity solvent in which material of the electron injection layer 104 is dissolved, a solvent including OH group such as alcohols or glycerols can be used, for example.

To be specific, methanol, ethanol, propanol, isopropanol, butyl alcohol, ethylene glycol, ethylene glycol monoethyl ether, ethylene glycol monoethyl ether, glycerol and the like can be used. A solution mixed with the above solvents may be used.

A solvent may be a single solvent, or may be made from various solvents. A solvent may be a mixed solvent including a plurality of polarity solvents, or may be a mixed solvent including a polarity solvent and a nonpolar solvent.

It is preferred that the density of the material of the electron injection layer is from 0.05 wt % to 5 wt % in a solution including the material of the electron injection layer and polarity solvent.

As an applying method, the ink jet method, dispenser method, nozzle coating method, intaglio printing, letterpress printing, and the like can be used.

Step of Forming the Light Emitting Layer 105:

The light emitting layer 105 is formed by the wet process on the electron injection layer 104.

In this step, the above-mentioned material for the light emitting layer is dissolved in a solvent to form ink. This ink is applied between the adjacent banks 103 and dried to be the light emitting layer. Material that is used differs in accordance with luminescent color. When forming the ink, a nonpolar solvent is used for dissolving material of the light emitting layer 105.

As a nonpolar solvent, an aromatic solvent is preferred to be used. To be specific, a solvent mainly including a benzene ring such as toluene or xylene, or a heterocyclic aromatic solvent such as pyridine are preferred to be used.

Examples of nonpolar solvents other than aromatic solvents include straight or branched chain aliphatic solvents such as hexane or 2-methylhexane, cycloaliphatic solvents such as cyclohexane, aliphatic solvents including halogen such as chloroform, or heterocyclic aliphatic solvents such as tetrahydrofuran.

A solvent used here may be a single solvent, or may be a mixed solvent made from various solvents.

As a method of applying ink, the ink jet method, the dispenser method, nozzle coating method, intaglio printing, letterpress printing, and the like can be used.

Step of Forming the Hole Transport Layer 106:

Material for the hole transport layer 106 is mixed with a solvent in a predetermined ratio to prepare ink for the hole transport layer. The ink is applied on the light emitting layer 105.

The applied ink covers the entire light emitting layer 105 and the banks 103.

As a method of applying ink to form the hole transport layer 106, the ink jet method, dispenser method, nozzle coating method, spin coating method, intaglio printing, letterpress printing, and the like are used.

The hole transport layer 106 is formed by drying the ink applied as above.

Step of Forming the Hole Injection Layer 107:

The hole injection layer 107 can be made by forming a thin film of metal oxide material such as a molybdenum oxide, a tungsten oxide and the like by the vacuum deposition method.

Step of Forming the Anode 108:

The anode 108 is formed on the surface of the hole injection layer 107 by forming a film of material such as ITO, IZO and the like by the vacuum deposition method or sputtering method.

In the case where a passivation layer is formed on the surface of the anode 108, the passivation layer can be formed by forming a film of silicon nitride (SiN), silicon oxynitride (SiON) and the like by the vacuum deposition method.

According to the above steps, the organic EL device is formed on the substrate. This completes formation of the display panel 100.

(Manufacturing Method of Polymer Compound)

The following describes a method of manufacturing a polymer compound represented by the above general structural formula (1).

The polymer compound represented by the general structural formula (1) can be obtained by condensing and polymerizing the compound represented by the general structural formula (4) shown by the following [CHEM. 16] and the compound represented by the general structural formula (5) in the presence of a condensation catalyst and a base.

[CHEM. 16]

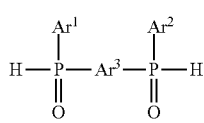

(4)

$$X-Ar^4-X \tag{5}$$

In the formula (5), X represents a halogen atom selected from iodine, bromine and chlorine.

The temperature for reaction may vary from 60° C. to 180° C., but from 80° C. to 150° C. are preferred from the perspective of reaction time and yield.

Here, although a solvent used for polymerization is not particularly limited, it is preferred to use one or a combination of a straight or branched chain (C1-C8) alcohols, ethylene glycol, ethylene glycol monoethyl ether, ethylene glycol monoethyl ether, glycerol, dimethyl ether, dimethyl sulfoxide, dimethylacetamide, N-methylpyrrolidone, tetrahydrofuran, dioxane, toluene, xylene, benzonitrile and the like. In particular, ethylene glycol, ethylene glycol monoethyl ether, dimethyl ether, dimethyl sulfoxide, dimethylacetamide, N-methylpyrrolidone, tetrahydrofuran and dioxane are preferred from the perspective of yield and reaction time.

The amount of the solvent preferably falls within the range from 0.2 L to 100 L per 1 mol of monomer. More desirably, from 1 L to 10 L is preferred from the perspective of yield and reaction time.

Although the condensation catalyst is not particularly limited, a compound of palladium and nickel is preferred. For example, one of or a combination of palladium acetate, palladium-activated carbon, tetrakis(triphenylphosphine) palladium (0), [1,1'-Bis(diphenylphosphino)ferrocene] palladium (II) dichloride, Tris(dibenzylideneacetone)dipalladium (0), [1,3-bis(diphenylphosphino)propane] dichloronickel(II) can be used.

Although the amount of the catalyst is not particularly limited, it is desirable to use the catalyst from 0.0001 mol to 0.5 mol per 1 mol of monomer, and it is more desirable to use the catalyst from 0.001 mol to 0.1 mol from the perspective of yield and reaction time.

Further, it is also possible to use a ligand that can be added to the catalyst in a reaction solvent. As a ligand, 1,2-Bis(diphenylphosphino)ethane, 1,3-Bis (diphenylphosphino)propane, 1,4-Bis(diphenylphosphino)butane, Tri-tert-butylphosphine, 2-(Di-tert-butylphosphino)biphenyl and the like can be used. The amount of the ligand is preferred to be from 0.1 mol to 10 mol per the catalyst of 1 mol, and from 0.5 mol to 5 mol is more preferred.

Although a method of synthesizing Bis(arylphosphinoyl)arylene monomer is not particularly limited, this monomer can be synthesized by the following method.

[CHEM. 17]

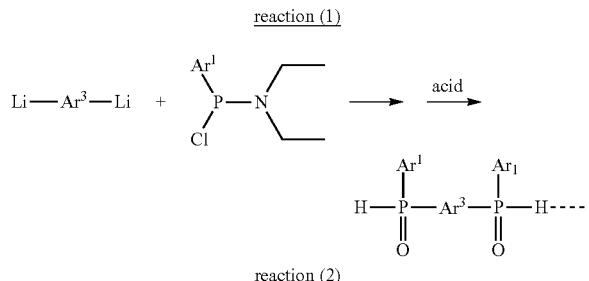

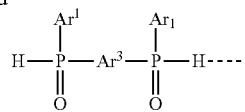

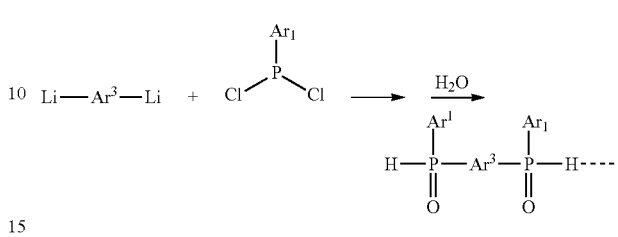

In reaction (1), Bis(arylphosphinoyl)arylene monomer is obtained by making a dilithioarylene compound react with arylchloroaminophosphine and undergo hydrolysis in an acid aqueous solution.

In reaction (2), Bis(arylphosphinoyl)arylene monomer is obtained by making a dilithioarylene compound react with aryl phosphonate ester. In the formula, R is not particularly limited if R is an alkyl group or an aromatic chromophore that is stable in an organic lithium compound.

In reaction (3), Bis(arylphosphinoyl)arylene monomer is obtained by making a dilithioarylene compound react with dichloro arylphosphine and undergo hydrolysis.

Compared with reaction (3), a side reaction is more unlikely to occur in reaction (1) because only one chloro group, which is a reactive site, is included. Therefore, reaction (1) is preferred from the perspective of yield. Further, phosphonate ester used in reaction (2) is not as active as phosphine chloride, and does not have as good a yield as phosphine chloride. Accordingly, reaction (1) is most preferred.

A dilithio compound, which is the source of reactions (1)-(3), can be synthesized with use of a conventional method. For example, the dilithio compound can be obtained with use of a dihalogen compound and a lithiating agent such as a butyllithium.

A dilithio compound can be replaced with a corresponding Grignard reagent.

(Effect Obtained by Organic EL Device 110 and Method of Manufacturing the Same)

According to the above-mentioned organic EL device 110, the electron injection layer 104 includes the above-mentioned polymer compound having the organic phosphine oxide skeleton. Such a polymer compound has excellent film-forming property, has the structure in which three aryl groups are linked to phosphine oxide, has electron-accepting property, has excellent electron-injection property, and is insoluble in a nonpolar solvent.

That is, although a low molecular organic phosphine oxide compound such as triphenylphosphine oxide is known as electron transport material, even in a high polymer organic phosphine oxide compound, electron-transporting property of the organic phosphine oxide skeleton is maintained.

Further, an organic phosphine oxide compound including a phosphine oxide group that is a polar group also has affinity for a nonpolar solvent such as toluene. Accordingly, the organic phosphine oxide compound is likely to dissolve when coming into contact with ink including a nonpolar solvent. However, when the organic phosphine oxide compound is a polymer compound, solubility thereof in a nonpolar solvent becomes low. Therefore, a layer formed from this polymer compound does not dissolve even when ink including a nonpolar solvent comes to contact with the layer.

Meanwhile, such a polymer compound is soluble in a polarity solvent such as alcohols, and accordingly, film can be formed by applying the polymer compound by the wet process. Further, the polymer compound has improved film-forming properties. This is because low molecular compounds easily crystallize and uniformity of film formed from them might be low, but polymer compounds are not likely to crystallize and uniform film is likely to be produced.

Here, high polymer compounds are low in diffusibility compared with low molecular compounds, and once dried, high polymer compounds are insoluble in a solvent. Accordingly, when the electron injection layer 104 is formed from a polymer compound having an organic phosphine oxide skeleton, the electron injection layer 104 is unlikely to dissolve even when ink is manufactured by dissolving light emitting layer material in a nonpolar solvent and the light emitting layer 105 is formed by applying the ink by the wet process in the step of forming the light emitting layer 105 on the electron injection layer 104.

Accordingly, since it is possible to stably form the electron injection layer 104 and its layered structure, uniformity in the luminescence brightness can be achieved, and a longer useful life for the organic EL device 110 can be promoted.

Further, the electron injection layer 104 is insoluble in a nonpolar solvent, and accordingly light emitting layer 105 can be formed from various high polymer materials soluble in a nonpolar solvent. That is, options for material of the light emitting layer 105 become wider.

Further, the above organic EL device 110 has the inverted structure in which the cathode 102 is provided to face the substrate 101. In the inverted structure, it is possible to have the pixel structure in which n-channel TFTs are formed on the substrate 101, the n-channel TFTs are connected to the cathode 102, and the anode 108 is a common electrode.

Further, by employing n-channel TFTs as TFTs, a driving speed of the organic EL device can be increased.

In particular, when μc-Si is used for a semiconductor layer of driving TFTs, only n-channel TFTs can be formed in practice. Accordingly, in this case, the inverted structure of the above organic EL device 110 is expected to be employed.

As described above, the organic EL device 110 pertaining to the present aspect increases options for designing an organic EL device, and is of practical value.

Experiment

[Experiments on Solvent Resistance of Electron Transport Material]

Figure 7:
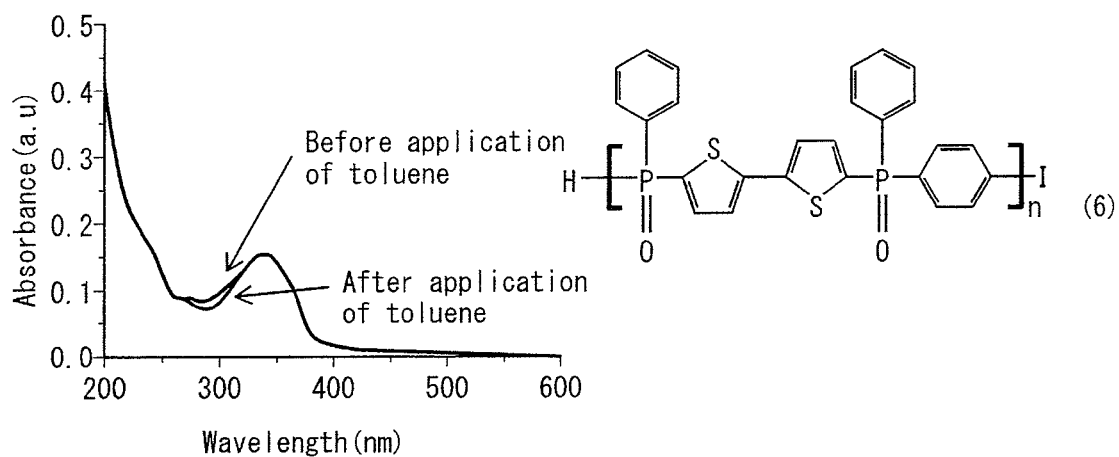
FIG. 7 shows a result of an experiment for examining toluene resistance of an organic phosphine oxide compound pertaining to Experiment.
Figure 8:
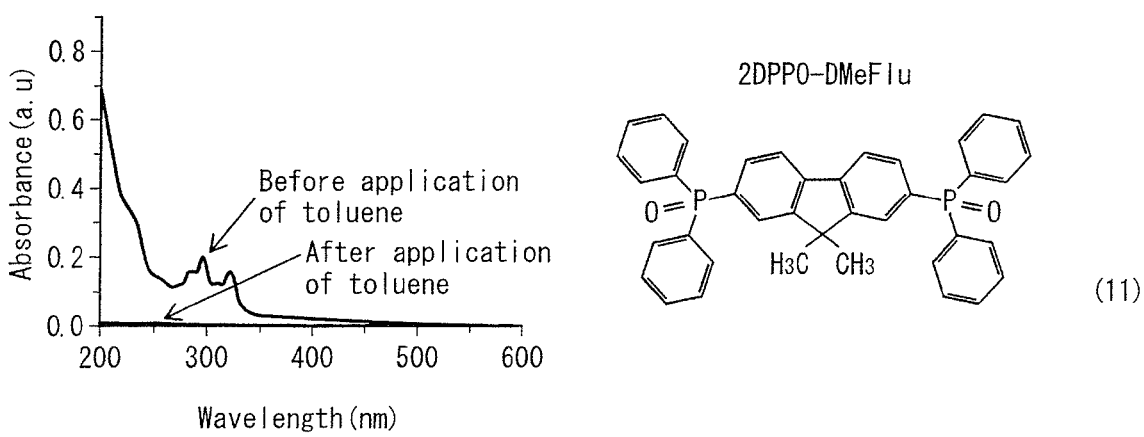
FIG. 8 shows a result of an experiment for examining toluene resistance of an organic phosphine oxide compound pertaining to a comparative example.

Toluene resistance of polymer compounds pertaining to Experiment shown by structural formulas (3) and (6) was examined as shown in FIGS. 6A-6C and FIG. 7, and a low molecular compound pertaining to a comparative example shown by a structural formula (11) was examined as shown in FIG. 8.

Although each of these compounds has a skeleton in which three aryl groups are linked to a phosphine oxide, compounds shown by the structural formulas (3) and (6) pertaining to Experiment are polymer compounds, and a compound shown by the structural formula (11) is a low molecular compound.

Note that three types of polymer compounds shown by the structural formula (3) pertaining to Experiment were manufactured by the following synthesizing method, and toluene resistance of each type was examined. The weighted average molecular weight Mw of each of these polymer compounds is 3300, 10000 or 1821.

Note that toluene resistance of the polymer compound shown by the structural formula (6) was examined in the case where its weighted average molecular weight Mw was 4703.

Examination Procedure:

The sample polymer compounds were applied on the surfaces of quartz substrates to form films. The films were formed by applying solutions of these compounds on the substrates by the spin coating method in the atmosphere, and by vacuum-drying the applied solutions for 30 minutes at 100° C. The thickness of each film was approximately 100 nm.

An absorptiometer measured absorbance for each wavelength of the substrates on which the films were formed. The examination results were represented by spectral curves indicated by "before application of toluene" in FIGS. 6A-6C through FIG. 8.

Subsequently, 0.15 ml of toluene was dropped on the films formed on the substrates, followed by the spin coating at 500 rpm for 45 seconds, and dried at 130° C. for 30 minutes.

Next, for each substrate, the absorptiometer measured absorbance of each wavelength. The examination results were represented by spectral curves indicated by "after application of toluene" in FIGS. 6A-6C through FIG. 8.

Three types of polymer compounds shown by the structural formula (3) pertaining to Experiment were examined. The weighted average molecular weight Mw of each of these polymer compounds is 3300, 10000 or 1821. As shown in FIGS. 6A-6B, the absorbance spectral curves of each polymer compound whose weighted average molecular weight Mw is equal to or more than 3300 are almost the same before and after applying toluene. As shown in FIG. 6C, absorbance of the polymer compound whose weighted average molecular weight Mw is 1821 decreases after applying toluene, but a waveform after applying toluene is similar to a waveform before applying toluene. Also, as shown in FIG. 7, the absorbance spectral curves of the polymer compound shown by the structural formula (6) are almost the same before and after applying toluene.

Further, numerically, absorbance of the polymer compound of the structural formula (6) at a wavelength of 340 nm was both 0.155 before and after applying toluene. This means that the films made of the polymer compounds shown by the structural formulas (3) and (6) are unlikely to dissolve when toluene is applied. That is, this means that the film has excellent toluene resistance.

In contrast, as shown in FIG. 8, the absorbance spectral curves of the low molecular compound pertaining to the comparative example of the structural formula (11) changes after applying toluene. After toluene is applied, absorbance is hardly observed. Numerically, at a wavelength of 323 nm, absorbance before applying toluene was 0.160, while absorbance after applying toluene was 0.001. This means that applied toluene dissolves most of the film and the film hardly remains.

Based on the above experimental results, the polymer compounds shown by the structural formulas (3) and (6) pertaining to Experiment have excellent toluene resistance compared with low molecular compound shown by the structural formula (11) pertaining to the comparative example.

In particular, although the polymer compound of the structural formula (3) and the low molecular compound of the structural formula (11) have the same basic structure of the organic phosphine oxide compounds, the polymer compound of the structural formula (3) is a chain polymer and has improved toluene resistance.

The reason why toluene resistance of a chain polymer is improved is considered to be that affinity between molecules of a chain polymer becomes so large that molecular chains tangle, and solvent molecules are unlikely to disentangle the chains. Further, this tendency increases as molecular weight of the chain polymer (degrees of polymerization) increases, and the polymer becomes more insoluble in a solvent.

Upon observing toluene resistance based on these experimental results, it is generally expected that toluene resistance is greatly improved by lengthening molecular chains of an organic phosphine oxide compound including an aryl group.

That is, not limited to the polymer compounds shown by the structural formulas (3) and (6), the polymer compounds shown by the general structural formulas (1) and (2) also have the structure in which aryl groups are linked to a phosphine oxide, and also are chain high polymers. Therefore, these compounds are considered to have excellent toluene resistance.

Further, not only when aryl groups are phenyl groups but also when aryl groups have the polycyclic structure or the heterocyclic structure, e.g., naphthyl groups, toluene resistance of these aryl groups improves when they are polymerized.

Note than when the same experiments were conducted on compounds pertaining to comparative examples shown by formulas (23)-(28) in the following CHEM. 18, it was found that film dissolved since absorbance spectral curves changed and absorbance was hardly observed after applying toluene.

[CHEM. 18]

(23)

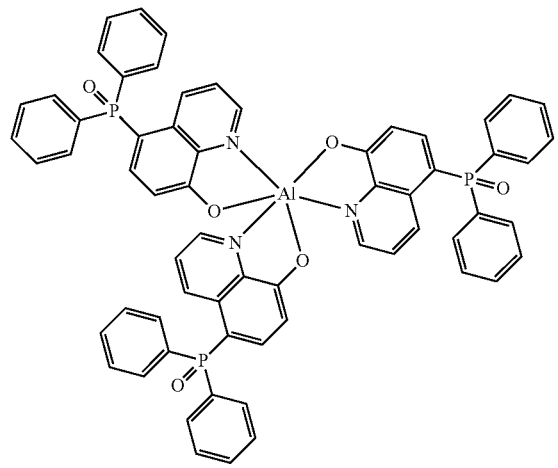

(24)

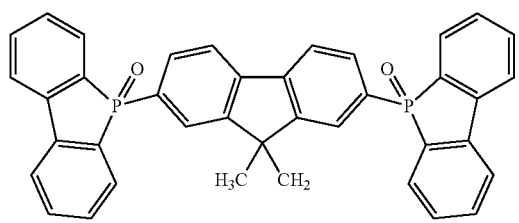

(25)

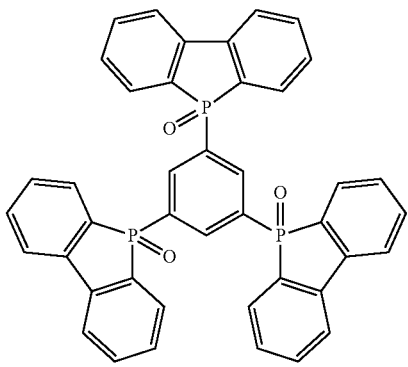

(26)

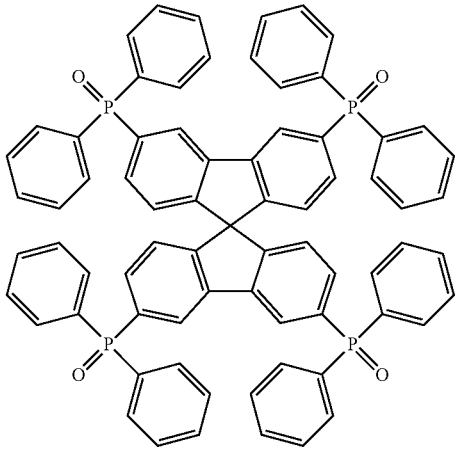

(27)

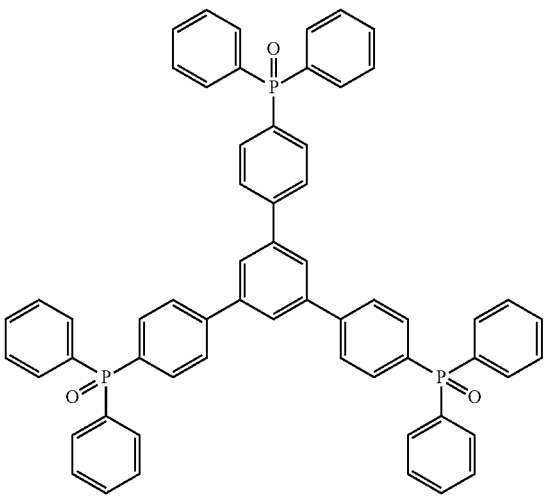

(28)

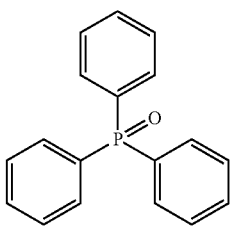

Based on the above observations, it is found that toluene resistance is generally improved by polymerizing a compound having an organic phosphine oxide skeleton.

Note that although the results of the experiments in which toluene was used as a nonpolar solvent are provided here, when experiments were conducted using other aromatic solvents other than toluene (e.g., benzene, xylene) or a mixed solvent including an aromatic solvent and a saturated hydrocarbon solvent, the results showed that resistance increased.

Further, even when experiments were conducted using only a nonpolar solvent other than an aromatic solvent, the same results were obtained (resistance increased).

Note that generally, polyvinyl pyrrolidone, polyethylene glycol and the like are known as nonionic high polymers soluble in alcohol, but the above polymers including phosphine oxide skeleton in which aryl groups are linked are hardly known. Such a polymer is a compound obtained by new molecular design achieved by the inventors of the present invention.

[Average Molecular Weight of Polymer Compound Having Organic Phosphine Oxide Skeleton]

It is desirable that the weighted average molecular weight Mw of the polymer compound having the organic phosphine oxide skeleton is equal to or more than 2000. This is because when the weighted average molecular weight Mw is equal to or more than 2000, the polymer compound is sufficiently insoluble in a nonpolar solvent.

Further, it is desirable that the weighted average molecular weight Mw of the polymer compound is equal to or less than one million. This is because when the electron transport layer 104 is formed by dissolving this polymer compound in a polarity solvent and applying the dissolved polymer by the wet process, if the weighted average molecular weight Mw is too large, the polymer compound is less likely to dissolve in the polarity solvent and it is difficult to apply the polymer compound by the wet process.

[Synthesizing Method of Polymer Compound Having Organic Phosphine Oxide Skeleton]

The following describes a method of synthesizing the polymer compounds shown by the structural formulas (3) and (6).

First, one example of the polymer compound shown by the structural formula (3) is described with reference to FIG. 9.

1. Synthesis of Chloro(diethylamino)phenylphosphine

Based on a method of Sciffers, etc., chloro(diethylamino)phenylphosphine was synthesized.

I. Schiffers, T. Rantanen, F. Schmidt, W. Bergmans, L. Zani, and C. Bolm, J. Org. Chem. 1971, 71, 2472.

Note that chloro(diethylamino)phosphine is dissolved by moisture or oxygen, and accordingly post-processing of the synthesis of chloro(diethylamino)phosphine is performed in an atmosphere of argon.

2. Synthesis of 2,7-Bis(phenylphosphinoyl)-9,9-dimethylfluorine (monomer)

In an atmosphere of nitrogen, at −80° C., 27.5 mL (44 mmol) of 1.6M n-butyllithium hexane solution was dropped in 150 mL of a THF solution of 7.04 g (20 mmol) of 2,7-dibromo-9,9-dimethylfluorine for 30 minutes, and mixed at −80° C. for two hours. This lithiates 2,7-dibromo-9,9-dimethylfluorine.

10.4 g (48 mmol) of chloro(diethylamino)phenylphosphine was added to this suspension. The suspension was mixed at −80° C. for 20 minutes, and mixed at room temperature for 14 hours.

While being cooled in ice bath, 25 mL of 12N hydrochloric acid was added to the reaction solution and the solution was reacted at room temperature for 7 hours. After the reaction completed, the reaction solution was diluted with 100 mL of water, and neutralized with sodium bicarbonate. This solution was extracted with dichloromethane, and after the organic layer was dried with magnesium sulfate, the solvent was removed under reduced pressure.

In this step of synthesizing 2,7-Bis(phenylphosphinoyl)-9,9-dimethylfluorine, dihalogen aryl was dilithiated and accordingly mono-phosphine oxide was also produced as a by-product other than the targeted monomer. 3.47 g of 2,7-Bis(phenylphosphinoyl)-9,9-dimethylfluorine was obtained as colorless oily matter (yield 39%) by refining residue using column chromatography (silica gel, eluent containing dichloromethane: methanol=20:1).

The obtained product (monomer) was measured by MS and NMR to be identified.

MS (FAB+, 3-nitro-benzyl-alcohol) m/z 443 (M+H)
$^1$H NMR (CDCl$_3$, 60 Hz) d 1.51 (s, 6H, CH$_3$), d 7.56-8.04 (m, 16H, d 8.17 (d, 2H, $^1$J=481 Hz, PH)

3. Polymerization of 2,7-Bis(phenylphosphinoyl)fluorine and 1,4-diiodo benzene 3-1

(1) 2,7-Bis(phenylphosphinoyl)fluorine (monomer), diiodo benzene, catalyst, ligand and base were dissolved in a solvent, and heated and mixed at a predetermined temperature for 20 hours.

Combinations of a solvent, a base and a reaction temperature varied as shown in Table 1. That is, dimethylacetamide (DMA) or N methylpyrrolidone (NMP) was used as the solvent, diisopropylethylamine (DIEA) or dimethylaminopyridine (DMAP) was used as the base, and the reaction temperature was 10° C. or 150° C.

Note that more excellent reproducibility can be obtained when deaeration and dehydration of the solvent are performed in polymerization.

The following shows one example of amounts of materials.
2,7-Bis(phenylphosphinoyl)-9,9-dimethylfluorene: 0.221 g (0.5 mmol)
p-Diiodobenzene: 0.165 g (0.5 mmol)
Palladium diacetate: 2.3 mg (0.01 mmol)
1,3-Bis(diphenylphosphino)propane: 8.3 mg (0.02 mmol)
N,N-dimethylaminopyridine: 0.916 mL (5.35 mmol)
Dimethyl sulfoxide: 2.5 mL (35.2 mmol)

(2) After the reaction completed, the reaction solution was poured in 40 mL of 1N hydrochloric acid, and extracted three times with 30 mL of dichloromethane.

(3) The organic layer was washed three times with 20 mL of 6N hydrochloric acid and 30 mL of water.

(4) After dried with magnesium sulfate, the organic layer was condensed under reduced pressure. The weight of residue measured after condensation is indicated by the field "weight A" in Table 1.

(5) The residue was dissolved in 2 mL of dichloromethane, dropped in 50 mL of cyclohexane that was being mixed, and reprecipitated. The weight obtained by reprecipitation is indicated in the field "weight B" in Table 1, and yield is indicated in the field "X" in Table 1.

The molecular weight of the obtained precipitation was measured by GPC.

The polymer obtained by reprecipitation was refined as follows so as to be a sample for evaluating a device.

(1) The polymer was washed with toluene by using Soxlet's extractor for 2-4 days.

(2) By using column chromatography (silica gel (manufactured by KANTO CHEMICAL CO., INC., K-60N)), a dichloromethane solution of the polymer was purified by column chromatography, and impurities were washed with 5% methanol-dichloromethane solution, and the polymer was eluted with methanol. The solvent of the obtained polymer solution was removed under reduced pressure, or the polymer solution was washed and refined by performing reprecipitation again.

The sample for evaluating a device was measured by NMR and IR.

$^1$H NMR (60 MHz, CDCl$_3$) d1.43 (s br, 6H, CH$_3$), 7.27-8.02 (m, 20H, Ar—H) IR(KBr) u 3402, 2919, 1598, 1438, 1182, 1113, 1002, 692, 554 cm$^{-1}$

The molecular weight of this yellow oily matter was measured by GPC (based on pSt standards), and 1821 of Mw and 858 of Mn were obtained.

Subsequently, one example of the method of synthesizing the polymer compound shown by the structural formula (6) is described with reference to FIG. 10.

1. Synthesis of 5,5'-Bis(phenylphosphinoyl)-2,2'-bithiophene

In an atmosphere of nitrogen, at −80° C., 25 mL (40 mmol) of 1.6M n-butyllithium hexane solution was added in a THF solution of 3.00 g (18 mmol) of 2,2'-bithiophene over a period of 10 minutes.

After mixing at −80° C. for 30 minutes, the mixture was mixed at room temperature for 2 hours.

TABLE 1

| condition | solvent | base | reaction temperature (°C.) | weight A (mg) | weight B (mg) | color | yield X (%) | Mw | Mn | PDI (Mw/Mn) | after column chromatography Mw | Mn | PDI |
|---|---|---|---|---|---|---|---|---|---|---|---|---|---|
| 1 | DMA | DIEA | 100 | 196 | 107 | pale peach | 41 | 8414 | 3149 | 2.67 | | | |
| 2 | | DMAP | 100 | 370 | 253 | peach | 98 | 7142 | 2417 | 2.95 | 4802 | | |
| 3 | | DMAP | 150 | 480 | 266 | pale peach | 103 | 7213 | 2424 | 2.98 | | | |
| 4 | NMP | DIEA | 100 | 360 | 206 | peach | 80 | — | — | — | — | — | — |
| | | | | — | 80 | pale peach | 31 | 8391 | 2139 | 3.92 | 10660 | 6267 | 1.70 |
| 5 | | DMAP | 100 | 390 | 278 | peach | 108 | 7873 | 2771 | 2.84 | 8435 | 3804 | 2.22 |
| 6 | | DMAP | 100 | 570 | 279 | gray | 108 | 7626 | 3129 | 2.52 | 6245 | 2430 | 2.57 |

*The weight-average molecular weight Mw and the number average molecular weight Mn were calculated by Shodex GPC K-804L manufactured by Showa Denko K.K. by using polystyrene as reference. In GPC, detection was performed using 0.5% triethylamine-chloroform solution. In this case, the flow rate was 1.0 mL/min, and the wavelength was 254 nm.
*The yield X was calculated based on molecular weight (516) per repeated structures.

Under conditions different from the above item 3-1, polymerization reaction was conducted as follows.

265 mg (0.6 mmol) of 2,7-Bis(phenylphosphinoyl)-9,9-dimethylfluorine, 165 mg (0.5 mmol) of 1,4-diiodo benzene, 2.3 mg (0.01 mmol) of palladium acetate, 8.2 mg (0.02 mmol) of 1,3-(diphenylphosphinoyl)propane and 0.93 mL of diisopropylethylamine were dissolved in 2.5 mL of 1-methyl-2-pyrrolidone, and deaeration was performed at −80° C. After that, a balloon filled with argon was attached and the solution was mixed at 100° C. for 24 hours. After the reaction completed, the reaction solution was dissolved in 100 mL of 1N hydrochloric acid, and extracted three times with 100 mL of dichloromethane. The organic layer was washed three times with 100 mL of water, dried with magnesium sulfate, and then condensed under reduced pressure. The concentrate was obtained and dissolved in 4 mL of THF and 5 mL of dichloromethane, and poured in cyclohexane. The precipitation was observed and collected by filtration under reduced pressure, and 314 mg of white solid was obtained.

The molecular weight of this white solid was measured by GPC (based on pSt standards), and 6307 of Mw and 2681 of Mn were obtained.

Note that in the reprecipitation, an attempt was made to use THF, which is considered to be likely to disperse in cyclohexane, to dissolve the polymer, but the compound was not likely to dissolve. Accordingly, dichloromethane was further added to dissolve the polymer.

291 mg of the obtained solid was added in cylindrical chromatography paper, and Soxhlet extraction was carried out with 80 mL of toluene for 15 hours. The filtrate was condensed, and 22 mg of yellow oily matter was obtained.

The mixture was cooled again to −80° C. 9.32 g (43.2 mmol) of chloro(diethylamino)phenylphosphine was added to the mixture. The mixture was mixed for 1 hour at −80° C., and for 5.5 hours at room temperature.

22.5 mL (270 mmol) of 12N hydrochloric acid was added to this solution. The solution was mixed at room temperature for 12 hours.

100 mL of water was added to the solution. The solution was neutralized with sodium bicarbonate and extracted with dichloromethane.

The organic layer was dried with magnesium sulfate, and the solvent was removed under reduced pressure. The residue was refined by column chromatography (silica gel, eluent containing dichloromethane: methanol=100:2), and 3.26 g of 5,5'-Bis(phenylphosphinoyl)-2,2'-bithiophene was obtained as yellow oily matter (44% of yield).

The obtained product (monomer) was measured by MS and NMR to be identified.

MS (FAB+, 3-nitro-benzyl-alcohol) m/z 415 (M+H)
$^1$H NMR (CDCl$_3$, 60 Hz) d 4.68 (d, 2H, 1 J=73.4 Hz, PH), d 7.27-8.01 (m, 14H)

2. Polymerization of 5,5'-Bis(phenylphosphinoyl)-2, 2'-bithiophene and 1,4-diiodo benzene 414 mg (1 mmol) of 5,5'-Bis(phenylphosphinoyl)-2,2'-bithiophene, 330 mg (1 mmol) of 1,4-diiodo benzene, 4.5 mg (0.02 mmol) of palladium acetate, 16.5 mg (0.04 mmol) of 1,3-Bisdiphenylphosphinopropane and 1.31 g (10.7 mmol) of dimethylaminopyridine were dissolved in 5 mL of dimethylacetamide, and reacted at 100° C. for 4 days.

After the reaction completed, the reaction solution was poured in 1N hydrochloric acid, and extracted with dichloromethane.

The organic layer was dried with magnesium sulfate, and the solvent was removed under reduced pressure.

The residue was dissolved in 5 mL of dichloromethane. The solution was poured into 50 mL of cyclohexane, and the residue was reprecipitated. After precipitation was filtered, the residue was dried under reduced pressure, and 446 mg of a polymer was obtained (91% of yield).

The obtained polymer was washed with toluene by using Soxlet's extractor for 2 days. The obtained residue was dissolved in dichloromethane, purified by column chromatography (silica gel), washed with 5% methanol-dichloromethane solution, and eluted with 50% methanol-dichloromethane solution. The solvent of the obtained solution was removed under reduced pressure, and 236 mg of a polymer was obtained.

The weighted average molecular weight Mw and the number average molecular weight Mn, and NMR of the obtained polymer were measured. 4703 of Mw, 1279 of Mn (based on pSt standards)

1H NMR (60 MHz, CDCl$_3$) d7.28-7.83 (m, 16H)

[Characteristics and Effects of the Above Synthesizing Method]

According to the above synthesizing methods shown in FIGS. 9 and 10, in the steps of synthesizing a monomer, chloro(diethylamino)phenylphosphine was reacted with M-Ar-M (Ar is an aryl group, M is metal). It is therefore possible to synthesize a targeted monomer while reducing side reaction. As a result, the reaction efficiency can be increased.

That is, a phosphine compound having a plurality of sites that react with Ar-M, e.g., dichlorophenylphosphine, forms P—Ar—P—Ar—P bridges, and is likely to be polymerized as shown in CHEM. 19.

[CHEM. 19]

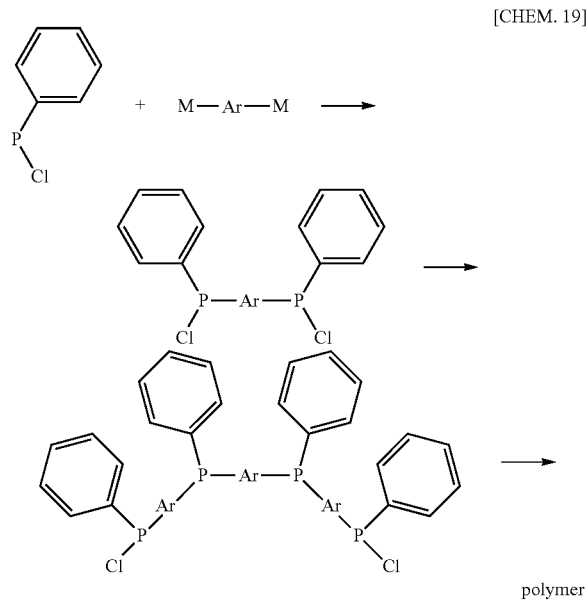

In contrast, chloro(diethylamino)phenylphosphine has one site that reacts with Ar-M. Accordingly, when chloro(diethylamino)phenylphosphine reacts with M-Ar-M, a monomer can be synthesized while reducing polymerization, as shown in the following CHEM. 20.

[CHEM. 20]

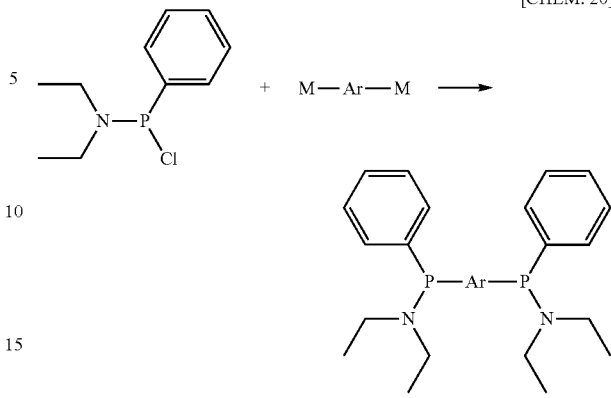

The synthesizing methods of the polymer compounds of the structural formulas (3) and (6) have been described above, and polymer compounds shown by the general structural formulas (1) and (2) can be synthesized in the same manner.

[Performance Comparison of Organic EL Devices]

The usefulness of the present invention is considered by manufacturing the organic EL devices pertaining to Experiment 1 and Comparative Examples 1-2, and by comparing the performances thereof.

Experiment 1

Figure 5:
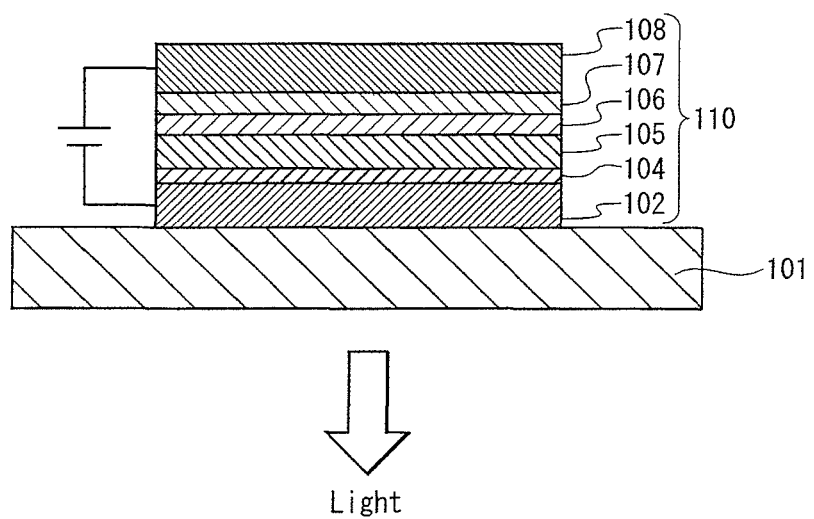
FIG. 5 is a schematic cross-section diagram showing the structure of an organic EL device pertaining to Experiment 1.

FIG. 5 is a schematic cross-section diagram showing the structure of an organic EL device pertaining to Experiment 1.

The substrate 101 was made of Non-alkali glass manufactured by Matsunami Glass Ind., Ltd. On the surface of this substrate 101, the cathode 102, the electron transport layer 104, the light emitting layer 105, the hole transport layer 106, the hole injection layer 107, and the anode 108 are formed in the stated order.

The cathode 102 was formed as follows: 50 nm of an ITO film was formed by the sputtering method on the substrate 101; by photolithography using photoresist, this ITO film was patterned by etching; and the photoresist was removed. Subsequently, after washed with neutral detergent and pure water, the substrate was washed using a UV/ozone cleaning method.

The electron injection layer 104 was formed as follows: lithiumacetylacetate was mixed with the polymer compound of the above structural formula (3) at 10 wt %; the mixture was dissolved in the mixed solution of n-butanol and ethanol, and was applied by the spin coating method; and the applied solution was baked in nitrogen at 130° C. The rotational speed of spin coating was 4000 rpm. The thickness of the electron injection layer 104 after baking was 20 nm.

The light emitting layer 105 includes Super Yellow manufactured by Merck & Co., Inc. as light-emitting material, and was formed by applying the solution including Super Yellow dissolved in 4-methoxytoluene and baking the applied solution at 130° C. The solution was applied by the spin coating method. The thickness of the light emitting layer 105 after baking was 50 nm.

The hole transport layer 106 was formed by forming film made of diphenyl naphthyl diamine (NPD, manufactured by Nippon Steel Chemical Co., Ltd.) by the vacuum deposition method, and its thickness was 60 nm.

The hole injection layer 107 was formed by forming film made of molybdenum oxide (MoOx, manufactured by JAPAN PURE CHEMICAL CO., LTD.) by the vacuum deposition method, and its thickness was 20 nm. Finally, the anode 108 was formed by forming film made of aluminum (manufactured by JAPAN PURE CHEMICAL CO., LTD. 99.9% of purity) by the vacuum deposition method, and its thickness was 80 nm. This completed the organic EL device pertaining to Experiment 1.

Note that unillustrated in FIG. 5, the manufactured organic EL device was sealed in a sealing cap in a nitrogen dry box with water and oxygen concentration equal to or less than 5 ppm such that the organic EL device could be evaluated in the air.

Comparative Example 1

An organic EL device pertaining to Comparative Example 1 was formed in a similar manner to the above Experiment 1 except a point in which the electron transport layer 104 was not formed.

Comparative Example 2

The organic EL device pertaining to Comparative Example 2 was formed as follows: on the substrate 101 that is the same as that of the above Experiment 1, the anode was made of ITO; a hole injection layer made of PEDOT:PSS was layered on the anode, and its thickness was 70 nm; on the hole injection layer, a light emitting layer was layered in the same manner as in Experiment 1; an electron injection layer made of barium (Ba, manufactured by Aldrich) was layered on the light emitting layer by the vacuum deposition method, and its thickness was 5 nm; and a cathode made of aluminum that is the same as that of Experiment 1 was layered on the electron injection layer, and its thickness was 80 nm.

The performances of the organic EL devices of Experiment 1 and Comparative Examples 1-2 were evaluated by performing the following experiments.

While changing voltage between an anode and a cathode from −3.5V to 11V in units of 0.25V, the current flowing through the anode and the cathode, luminance and chromaticity were measured. Further, based on the measurement results, the luminous efficiency was calculated.

Regarding an evaluating apparatus, Keythley2400 was used as a current source and an ammeter.

MC-940 manufactured by Otsuka Electronics Co., Ltd. was used as a luminance meter.

Table 2 shows the measurement results in the case where a voltage of 9V was applied.

TABLE 2

|   | luminance (cd/m2) | luminous efficiency (cd/A) |
|---|---|---|
| Experiment 1 | 155 cd/m$^2$ | 5.4 cd/A |
| Comparative Example 1 | no luminance | no luminance |
| Comparative Example 2 | 1200 cd/m$^2$ | 0.6 cd/A |

It is found from the results shown in Table 2 that the organic EL device of Experiment 1 is excellent in luminance and luminous efficiency, but the organic EL device of the Comparative Example 1, which does not include the electron transport layer 104, does not emit light normally.

Further, like Comparative Example 2, when the organic EL device is formed by layering the cathode, the hole injection layer made of PEDOT:PSS, and the light emitting layer in the stated order, the organic EL device has excellent luminance and luminous efficiency. In this case, however, the organic EL device does not have the inverted structure.

<Modifications, Etc.>

In the above Experiment, the electron injection layer 104 was formed by the wet process in which ink formed by dissolving a polymer compound having an organic phosphine oxide skeleton in a solvent is applied. However, a method of forming the electron injection layer 104 is not limited to the wet process. The electron injection layer 104 may be formed by forming a thin film of the polymer compound having the organic phosphine oxide skeleton. In this case, when the light emitting layer 105 is formed on the electron injection layer 104 by the wet process using a nonpolar solvent, the polymer compound constituting the electron injection layer 104 does not dissolve in a nonpolar solvent. Therefore, the same effect is achieved.

According to the above Experiment, the electron injection layer 104 is formed as the first layer by using the polymer compound having the organic phosphine oxide skeleton, and the light emitting layer 105 is formed as the second layer on the first layer by dissolving material in a nonpolar solvent. After forming the electron injection layer 104 as the first layer by using the polymer compound having the organic phosphine oxide skeleton, an electron transport layer or a hole blocking layer may be formed as the second layer by using a nonpolar solvent by the wet process instead of the light emitting layer, and the light emitting layer may be layered on the second layer.

In this case, organic material for forming the electron transport layer or the hole blocking layer is dissolved in a nonpolar solvent to form ink, and the ink is applied on the first layer to form the second layer. The organic phosphine oxide compound constituting the first layer does not dissolve in a nonpolar solvent, and accordingly, the same effect is achieved.

The hole blocking layer is formed from hole blocking material that transports electrons and rarely transports holes. Accordingly, by blocking holes, recombination probability of electrons and holes is improved.

In this case, examples of material of the electron transport layer and the hole blocking layer include nitration fluorine derivative, diphenylquinone derivative, thiopyran dioxide derivative, carbodiimide, fluorenylidenemethane derivative, derivative of anthraquinodimethane and anthrone, and oxadiazole derivative. Further, electron transport material may include thiadiazole derivative that is formed by replacing oxygen atom of oxadiazole ring of oxadiazole derivative with sulfur atom, and quinoxaline derivative including quinoxaline ring known as electron-withdrawing substituent. Further, it is possible to use high polymer material whose high polymer chain including the above material, or high polymer material whose main chain is the above material.

Further, in the above Experiment, the electron injection layer may be formed as the first layer. The first layer may be the electron transport layer, and the second layer may be the light emitting layer or a hole blocking layer.

In this case, on the electron injection layer, the electron transport layer is formed by using the polymer compound having the organic phosphine oxide skeleton as the first layer, and the second layer is formed by applying, on the first layer, ink made by dissolving organic material for forming the light emitting layer or the hole blocking layer in a nonpolar solvent. The polymer compound having an organic phosphine oxide skeleton constituting the first layer does not dissolve in a nonpolar solvent, and as a result, the same effect is achieved.

The organic EL device described in the above Experiment is bottom emission type that emits light from the substrate side. However, the organic EL device may be top emission type that emits light from the side opposite of the substrate side. Alternatively, light may be emitted from both the substrate side and the side opposite of the substrate side.

In the above Experiment, an example in which the organic EL device of the present disclosure is applied to an organic EL display apparatus is provided. The organic EL device pertaining to the present disclosure may be applied to an organic EL lighting apparatus.

INDUSTRIAL APPLICABILITY

The organic EL device pertaining to the present disclosure can be applied to a display device of a mobile phone, a television and the like, and is useful in manufacturing a display device and a lighting apparatus whose light emitting characteristics are excellent.

REFERENCE SIGNS LIST 100 display panel
101 substrate
102 cathode
103 bank
104 electron injection layer
105 light emitting layer
106 hole transport layer
107 hole injection layer
108 anode
110 organic EL device

The invention claimed is:

1. A method of manufacturing an organic EL device having a substrate, and a cathode, a plurality of organic layers and an anode layered on the substrate in an order as stated, the method comprising:
a first step of forming, by a wet process, a first organic layer including a polymer compound having an organic phosphine oxide skeleton; and
a second step of forming, on the first organic layer, a second organic layer by a wet process using a solution including organic material and a solvent, the solvent being at least one selected from the group consisting of an aromatic solvent including a benzene ring and an aliphatic solvent including alkyl or alkene, wherein
the polymer compound is soluble in an alcohol solvent and insoluble in the solvent used in the second step, and is represented by the following structural formula:

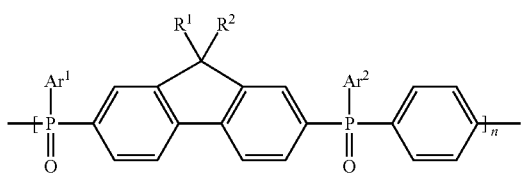

where each of $Ar^1$ and $Ar^2$ is a monovalent aromatic chromophore, each of $R^1$ and $R^2$ is an aliphatic substituent, and n is an integer of 2 or more.

2. The method according to claim 1, wherein
in the first step, the first organic layer is formed by using a solution including an alcohol solvent.

3. The method according to claim 1, wherein
in the first step, the first organic layer is formed by using a solution including at least one of alkali metal, alkali earth metal and rare earth metal.

4. The method according to claim 1, wherein
the polymer compound has a weighted average molecular weight that is equal to or more than 2000.

5. The method according to claim 1, wherein
the wet process used in the second step is an ink jet method.

6. An organic EL device comprising a substrate, and a cathode, a plurality of organic layers and an anode layered on the substrate in an order as stated, wherein
the plurality of organic layers include:
a first organic layer including a polymer compound having an organic phosphine oxide skeleton; and
a second organic layer made of organic material layered on the first organic layer, and
the polymer compound is soluble in an alcohol solvent and insoluble in an aromatic solvent including a benzene ring or an aliphatic solvent including alkyl or alkene, and is represented by the following structural formula:

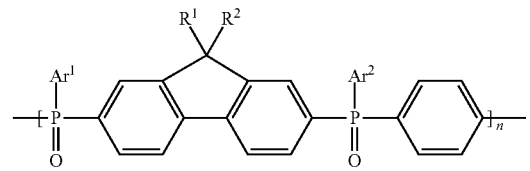

where each of $Ar^1$ and $Ar^2$ is a monovalent aromatic chromophore, each of $R^1$ and $R^2$ is an aliphatic substituent, and n is an integer of 2 or more.

7. The organic EL device according to claim 6, wherein
the polymer compound has a weighted average molecular weight that is equal to or more than 2000.

8. The organic EL device according to claim 6, wherein
the first organic layer further includes at least one of alkali metal, alkali earth metal and rare earth metal.

9. The organic EL device according to claim 8, wherein
the alkali metal, the alkali earth metal or the rare earth metal is mixed in the first organic layer as an organometallic complex.

10. The organic EL device according to claim 6, wherein
the second organic layer is one of a light emitting layer, an electron transport layer and a hole blocking layer.

11. A polymer compound for forming an organic layer of an organic EL device, the polymer compound being represented by the following structural formula:

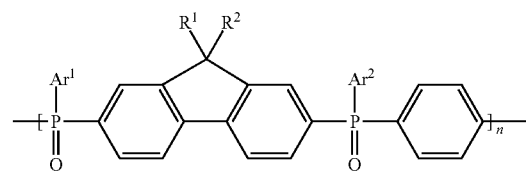

where each of $Ar^1$ and $Ar^2$ is an aromatic chromophore, each of $R^1$ and $R^2$ is an aliphatic substituent, and n is an integer of 2 or more.

12. The polymer compound according to claim 11 represented by the following structural formula:

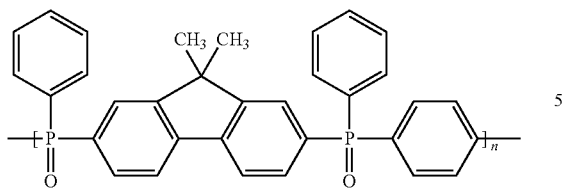
where n is an integer of 2 or more.
13. The polymer compound according to claim 11, wherein the polymer compound has a weighted average molecular weight that is equal to or more than 2000.
14. The polymer compound according to claim 12, wherein the polymer compound has a weighted average molecular weight that is equal to or more than 2000.
* * * * *